(12) United States Patent
Rozbicki

(10) Patent No.: US 8,043,484 B1
(45) Date of Patent: *Oct. 25, 2011

(54) METHODS AND APPARATUS FOR RESPUTTERING PROCESS THAT IMPROVES BARRIER COVERAGE

(75) Inventor: Robert Rozbicki, San Francisco, CA (US)

(73) Assignee: Novellus Systems, Inc., San Jose, CA (US)

( * ) Notice: Subject to any disclaimer, the term of this patent is extended or adjusted under 35 U.S.C. 154(b) by 964 days.

This patent is subject to a terminal disclaimer.

(21) Appl. No.: 11/830,777

(22) Filed: Jul. 30, 2007

Related U.S. Application Data

(63) Continuation-in-part of application No. 11/588,586, filed on Oct. 26, 2006, now Pat. No. 7,781,327, which is a continuation-in-part of application No. 10/804,353, filed on Mar. 18, 2004, now Pat. No. 7,186,648, which is a continuation-in-part of application No. 10/412,562, filed on Apr. 11, 2003, now Pat. No. 6,764,940, which is a continuation-in-part of application No. 09/965,472, filed on Sep. 26, 2001, now Pat. No. 6,607,977, said application No. 10/412,562.

(60) Provisional application No. 60/275,803, filed on Mar. 13, 2001, provisional application No. 60/379,874, filed on May 10, 2002.

(51) Int. Cl.
*C23C 14/00* (2006.01)
*C23C 14/32* (2006.01)
*H01L 21/76* (2006.01)
*H01L 21/00* (2006.01)

(52) U.S. Cl. ......... 204/192.33; 204/192.32; 204/192.35; 204/192.37; 438/424; 438/485

(58) Field of Classification Search ............. 204/192.17, 204/298.03, 192.32, 192.33, 192.35, 192.37; 438/622, 637, 652, 679, 424, 485

See application file for complete search history.

(56) References Cited

U.S. PATENT DOCUMENTS 3,763,031 A    10/1973  Scow et al.

(Continued)

FOREIGN PATENT DOCUMENTS

CN    1567548    1/2005

(Continued)

OTHER PUBLICATIONS

Schumacher Products, TDEAT (Tetrakis-diethylamino Titanium), Electronic Grade, www.schumacher.com/tdeat.html, printed Jun. 5, 2001, 1 page.

(Continued)

*Primary Examiner* — Alexa Neckel
*Assistant Examiner* — Michael Band
(74) *Attorney, Agent, or Firm* — Weaver Austin Villeneuve & Sampson LLP

(57) ABSTRACT

Conductive or barrier material is deposited on a semiconductor substrate having recessed features by a method that has at least two operations. The first operation involves depositing a layer of the material on at least a portion of the field regions of the wafer. The second operation involves resputtering at least the layer residing on the field region of the wafer under high pressure. If the pressure is sufficiently high, momentum transfer reflection of the resputtered material will take place, such that at least some of the resputtered material is placed in the recessed features of the wafer. This approach can, among other advantages, offer improved step coverage and better utilization of the material.

27 Claims, 14 Drawing Sheets

U.S. PATENT DOCUMENTS

| | | | |
|---|---|---|---|
| 3,767,551 A | 10/1973 | Lang et al. |
| 4,058,430 A | 11/1977 | Suntola et al. |
| 4,392,111 A | 7/1983 | Rostoker |
| 4,492,620 A | 1/1985 | Matsuo et al. |
| 4,588,490 A | 5/1986 | Cuomo et al. |
| 4,604,180 A | 8/1986 | Hirukawa et al. |
| 4,609,903 A | 9/1986 | Toyokura et al. |
| 4,622,121 A | 11/1986 | Wegmann et al. |
| 4,737,384 A | 4/1988 | Murthy et al. |
| 4,874,493 A | 10/1989 | Pan |
| 4,963,524 A | 10/1990 | Yamazaki |
| 4,997,539 A | 3/1991 | Komizo et al. |
| 4,999,096 A | 3/1991 | Nihei et al. |
| 5,009,963 A | 4/1991 | Ohmi et al. |
| 5,084,412 A | 1/1992 | Nakasaki |
| 5,126,028 A | 6/1992 | Hurwitt et al. |
| 5,139,825 A | 8/1992 | Gordon et al. |
| 5,178,739 A | 1/1993 | Barnes et al. |
| 5,194,398 A | 3/1993 | Miyachi et al. |
| 5,221,449 A | 6/1993 | Colgan et al. |
| 5,281,485 A | 1/1994 | Colgan et al. |
| 5,298,091 A | 3/1994 | Edwards, III et al. |
| 5,378,506 A | 1/1995 | Imai et al. |
| 5,482,611 A | 1/1996 | Helmer et al. |
| 5,622,608 A | 4/1997 | Lanford et al. |
| 5,629,221 A | 5/1997 | Chao et al. |
| 5,654,233 A | 8/1997 | Yu |
| 5,656,860 A | 8/1997 | Lee |
| 5,766,379 A | 6/1998 | Lanford et al. |
| 5,789,027 A | 8/1998 | Watkins et al. |
| 5,801,089 A | 9/1998 | Kenney |
| 5,904,565 A | 5/1999 | Nguyen et al. |
| 5,948,215 A | 9/1999 | Lantsman |
| 5,962,923 A | 10/1999 | Xu et al. |
| 5,969,422 A | 10/1999 | Ting et al. |
| 5,985,762 A | 11/1999 | Geffken et al. |
| 6,037,257 A | 3/2000 | Chiang et al. |
| 6,046,108 A | 4/2000 | Liu et al. |
| 6,051,114 A | 4/2000 | Yao et al. |
| 6,074,544 A | 6/2000 | Reid et al. |
| 6,077,403 A | 6/2000 | Kobayashi et al. |
| 6,077,780 A | 6/2000 | Dubin |
| 6,080,285 A | 6/2000 | Liu et al. |
| 6,093,966 A | 7/2000 | Venkatraman et al. |
| 6,099,702 A | 8/2000 | Reid et al. |
| 6,100,200 A | 8/2000 | Van Buskirk et al. |
| 6,105,078 A | 8/2000 | Crockett et al. |
| 6,110,346 A | 8/2000 | Reid et al. |
| 6,114,238 A | 9/2000 | Liao |
| 6,120,641 A | 9/2000 | Stevens et al. |
| 6,124,203 A | 9/2000 | Joo et al. |
| 6,126,798 A | 10/2000 | Reid et al. |
| 6,139,712 A | 10/2000 | Patton et al. |
| 6,147,000 A | 11/2000 | You et al. |
| 6,156,167 A | 12/2000 | Patton et al. |
| 6,159,354 A | 12/2000 | Contolini et al. |
| 6,159,857 A | 12/2000 | Liu et al. |
| 6,162,344 A | 12/2000 | Reid et al. |
| 6,179,973 B1 | 1/2001 | Lai et al. |
| 6,179,983 B1 | 1/2001 | Reid et al. |
| 6,193,854 B1 | 2/2001 | Lai et al. |
| 6,193,855 B1 * | 2/2001 | Gopalraja et al. ....... 204/192.12 |
| 6,200,893 B1 | 3/2001 | Sneh |
| 6,203,613 B1 | 3/2001 | Gates et al. |
| 6,217,716 B1 | 4/2001 | Fai Lai |
| 6,221,757 B1 | 4/2001 | Schmidbauer et al. |
| 6,228,754 B1 | 5/2001 | Iacoponi et al. |
| 6,235,163 B1 | 5/2001 | Angelo et al. |
| 6,249,055 B1 | 6/2001 | Dubin |
| 6,251,242 B1 | 6/2001 | Fu et al. |
| 6,265,313 B1 | 7/2001 | Huang et al. |
| 6,271,591 B1 | 8/2001 | Dubin et al. |
| 6,274,008 B1 * | 8/2001 | Gopalraja et al. ....... 204/192.17 |
| 6,277,249 B1 | 8/2001 | Gopalraja et al. |
| 6,280,597 B1 | 8/2001 | Kashiwada et al. |
| 6,287,977 B1 | 9/2001 | Hashim et al. |
| 6,333,547 B1 | 12/2001 | Tanaka et al. |
| 6,340,435 B1 | 1/2002 | Bjorkman et al. |
| 6,342,133 B2 | 1/2002 | D'Couto et al. |
| 6,342,448 B1 | 1/2002 | Lin et al. |
| 6,350,353 B2 | 2/2002 | Gopalraja et al. |
| 6,358,376 B1 | 3/2002 | Wang et al. |
| 6,387,805 B2 | 5/2002 | Ding et al. |
| 6,391,785 B1 | 5/2002 | Satta et al. |
| 6,395,642 B1 | 5/2002 | Liu et al. |
| 6,402,907 B1 | 6/2002 | Rich |
| 6,417,094 B1 | 7/2002 | Zhao et al. |
| 6,436,251 B2 | 8/2002 | Gopalraja et al. |
| 6,440,854 B1 | 8/2002 | Rozbicki |
| 6,444,104 B2 | 9/2002 | Gopalraja et al. |
| 6,448,176 B1 | 9/2002 | Grill et al. |
| 6,451,177 B1 | 9/2002 | Gopalraja et al. |
| 6,492,262 B2 | 12/2002 | Uzoh |
| 6,498,091 B1 | 12/2002 | Chen et al. |
| 6,500,762 B2 | 12/2002 | Hashim et al. |
| 6,509,267 B1 | 1/2003 | Woo et al. |
| 6,538,324 B1 | 3/2003 | Tagami et al. |
| 6,541,374 B1 | 4/2003 | de Felipe et al. |
| 6,554,914 B1 | 4/2003 | Rozbicki et al. |
| 6,559,061 B2 | 5/2003 | Hashim et al. |
| 6,562,715 B1 | 5/2003 | Chen et al. |
| 6,566,246 B1 | 5/2003 | de Felipe et al. |
| 6,589,887 B1 | 7/2003 | Dalton et al. |
| 6,605,534 B1 | 8/2003 | Chung et al. |
| 6,607,977 B1 | 8/2003 | Rozbicki et al. |
| 6,607,982 B1 | 8/2003 | Powell et al. |
| 6,613,199 B1 | 9/2003 | Tobin et al. |
| 6,624,066 B2 | 9/2003 | Lu et al. |
| 6,642,146 B1 | 11/2003 | Rozbicki et al. |
| 6,652,718 B1 | 11/2003 | D'Couto et al. |
| 6,656,841 B1 | 12/2003 | Kim |
| 6,660,622 B2 | 12/2003 | Chen et al. |
| 6,673,716 B1 | 1/2004 | D'Couto et al. |
| 6,683,425 B1 | 1/2004 | Lai |
| 6,706,142 B2 | 3/2004 | Savas et al. |
| 6,706,155 B2 | 3/2004 | Morimoto et al. |
| 6,709,557 B1 | 3/2004 | Kailasam et al. |
| 6,709,987 B2 | 3/2004 | Hashim et al. |
| 6,755,945 B2 | 6/2004 | Yasar et al. |
| 6,758,947 B2 | 7/2004 | Chiang et al. |
| 6,764,940 B1 | 7/2004 | Rozbicki et al. |
| 6,777,334 B2 | 8/2004 | Shiu et al. |
| 6,784,096 B2 | 8/2004 | Chen et al. |
| 6,790,776 B2 | 9/2004 | Ding et al. |
| 6,841,044 B1 | 1/2005 | Ruzic |
| 6,893,541 B2 | 5/2005 | Chiang et al. |
| 6,905,965 B2 | 6/2005 | Subrahmanyan et al. |
| 6,919,275 B2 | 7/2005 | Chiang et al. |
| 6,943,111 B2 | 9/2005 | Lin et al. |
| 6,949,457 B1 | 9/2005 | Fiordalice et al. |
| 6,969,448 B1 | 11/2005 | Lau |
| 6,992,012 B2 | 1/2006 | Hashim et al. |
| 7,030,031 B2 | 4/2006 | Wille et al. |
| 7,037,830 B1 | 5/2006 | Rumer et al. |
| 7,048,837 B2 | 5/2006 | Somekh et al. |
| 7,074,714 B2 | 7/2006 | Chiang et al. |
| 7,135,402 B2 | 11/2006 | Lin et al. |
| 7,186,648 B1 | 3/2007 | Rozbicki et al. |
| 7,253,109 B2 | 8/2007 | Ding et al. |
| 7,294,574 B2 | 11/2007 | Ding et al. |
| 7,365,001 B2 | 4/2008 | Yang et al. |
| 7,510,634 B1 | 3/2009 | Klawuhn et al. |
| 7,645,696 B1 | 1/2010 | Dulkin et al. |
| 7,659,197 B1 | 2/2010 | Juliano |
| 7,682,966 B1 | 3/2010 | Rozbicki et al. |
| 7,732,314 B1 | 6/2010 | Danek et al. |
| 7,745,332 B1 | 6/2010 | Shaviv et al. |
| 7,781,327 B1 * | 8/2010 | Kailasam et al. ............. 438/622 |
| 7,842,605 B1 | 11/2010 | Pradhan et al. |
| 7,855,147 B1 | 12/2010 | Dulkin et al. |
| 7,897,516 B1 | 3/2011 | Kinder et al. |
| 7,922,880 B1 | 4/2011 | Phadhan et al. |
| 2001/0039113 A1 | 11/2001 | Blalock et al. |
| 2002/0000382 A1 | 1/2002 | Morrissey et al. |
| 2002/0028576 A1 | 3/2002 | Hashim et al. |
| 2002/0041028 A1 | 4/2002 | Choi et al. |
| 2002/0110999 A1 | 8/2002 | Lu et al. |

| | | |
|---|---|---|
| 2002/0115287 A1 | 8/2002 | Hashim et al. |
| 2002/0162736 A1 | 11/2002 | Ngo et al. |
| 2003/0034244 A1 | 2/2003 | Yasar et al. |
| 2003/0116427 A1 | 6/2003 | Ding et al. |
| 2003/0129828 A1 | 7/2003 | Cohen |
| 2003/0216035 A1 | 11/2003 | Rengarajan et al. |
| 2004/0048461 A1 | 3/2004 | Chen |
| 2004/0094402 A1 | 5/2004 | Gopalraja et al. |
| 2004/0152301 A1 | 8/2004 | Hashim et al. |
| 2004/0171250 A1 | 9/2004 | Chiang et al. |
| 2004/0188239 A1 | 9/2004 | Robison et al. |
| 2004/0211661 A1 | 10/2004 | Zhang et al. |
| 2004/0216762 A1 | 11/2004 | Lo et al. |
| 2004/0224507 A1 | 11/2004 | Marieb et al. |
| 2004/0266175 A1 | 12/2004 | Chen et al. |
| 2005/0006222 A1 | 1/2005 | Ding et al. |
| 2005/0020080 A1 | 1/2005 | Chiang et al. |
| 2005/0032382 A1 | 2/2005 | Rossman |
| 2005/0085068 A1 | 4/2005 | Chiang et al. |
| 2005/0085070 A1 | 4/2005 | Park |
| 2005/0103620 A1 | 5/2005 | Chistyakov |
| 2005/0106865 A1 | 5/2005 | Chung et al. |
| 2005/0110147 A1 | 5/2005 | Wu et al. |
| 2005/0173239 A1 | 8/2005 | Somekh et al. |
| 2005/0186793 A1 | 8/2005 | Omoto et al. |
| 2005/0211545 A1 | 9/2005 | Cerio, Jr. et al. |
| 2005/0252765 A1 | 11/2005 | Zhang et al. |
| 2005/0255690 A1 | 11/2005 | Chen et al. |
| 2005/0255691 A1 | 11/2005 | Ding et al. |
| 2005/0255700 A1 | 11/2005 | Gopalraja et al. |
| 2005/0266682 A1 | 12/2005 | Chen et al. |
| 2005/0272254 A1 | 12/2005 | Ding et al. |
| 2006/0014378 A1 | 1/2006 | Aggrawal et al. |
| 2006/0024953 A1 | 2/2006 | Rao et al. |
| 2006/0030151 A1 | 2/2006 | Ding et al. |
| 2006/0057843 A1 | 3/2006 | Chen et al. |
| 2006/0125100 A1 | 6/2006 | Arakawa |
| 2006/0148253 A1 | 7/2006 | Chung et al. |
| 2006/0207873 A1 | 9/2006 | Fu |
| 2006/0258152 A1 | 11/2006 | Haider |
| 2007/0020922 A1 | 1/2007 | Chiang et al. |
| 2007/0178682 A1 | 8/2007 | Chiang et al. |
| 2007/0193982 A1 | 8/2007 | Brown et al. |
| 2007/0197012 A1 | 8/2007 | Yang et al. |
| 2007/0252277 A1 | 11/2007 | Tsao et al. |
| 2007/0283886 A1 | 12/2007 | Chung et al. |
| 2008/0142359 A1 | 6/2008 | Gopalraja et al. |
| 2008/0190760 A1 | 8/2008 | Tang et al. |
| 2008/0310005 A1 | 12/2008 | Tonar et al. |
| 2009/0233438 A1 | 9/2009 | Ding et al. |

FOREIGN PATENT DOCUMENTS

| | | |
|---|---|---|
| EP | 0 692 551 A1 | 1/1996 |
| JP | 11-186273 | 9/1999 |

OTHER PUBLICATIONS

Sun et al., Suppression of Cobalt Silicide Agglomeration Using Nitrogen (N2+) Implantation, IEEE Electron Device Letters, vol. 19, No. 5, May 1998, pp. 163-166.

Ashanti et al., "A New Hollow-Cathode Magnetron Source for 0.10. mu.m Copper Applications", Journal of Vacuum Science and Technology, A 18(4) Jul./Aug. 2000 p. 1546.

Cohen et al., "Reactive Preclean Technology for Nonphysical Copper Oxide Reduction for Advanced CU Interconnect", Jun. 16-Jun. 18, 1998, VMIC Conference, pp. 91 and 93.

Jian Li and J. W. Mayer and E. G. Colgan, "Oxidation and Protection in Copper and Copper Alloy Thin Films", J. Appl. Phys. 70 (5), Sep. 1, 1991, pp. 2820-2827.

Ding et al., "Observation of Reduced Oxidation Rates for Plasma-Assisted CVD Copper Films", Mat. Res. Soc. Symp. Proc., vol. 309, 1993 pp. 445-460.

Klawuhn et al., "Ionized Physical-vapor deposition Using a Hollow-Cathode Magnetron Source for Advanced Metallization", J. Vac, Sci, Technol. A18(4), Jul./Aug. 2000, pp. 1546-1549.

M. Zinke-Allmang, "Phase Separation on Solid Surfaces: Nucleation, Coarsening and Coalescence Kinetics".

Peijun Ding, et al., "Copper Barrier, Seed Layer and Planarization Technologies," VMIC Conference, Jun. 10-12, 1997, pp. 87-92.

Tarek Suwwan de Felipe, et al., "Electrical Stability and Microstructual Evolution in Thin Films of High Conductivity Copper Alloys," IEEE, Jun. 1999, pp. 293-295.

Cho et al., "Factors Affecting Passivation and Resistivity of Cu(Mg) Alloy Film," Materials Research Society Symposium Proc. vol. 564, 1999, pp. 353-358.

Murarka et al., "Copper Metallization for ULSI and Beyond," Critical Reviews in Solid State and Materials Sciences, 1995, pp. 87-124.

Braeckelmann et al. "Integration and Reliability of Copper Magnesium Alloys for Multilevel Interconnects," IEEE, Feb. 2000, pp. 236-238.

Arcot et al., "Intermetallic Formation in Copper/Magnesium Thin Films—kinetics, Nucleation and Growth, and Effect of Interfacial Oxygen," J. Appl. Phys. 76(9), Nov. 1, 1994, pp. 5161-5170.

Ding et al., "Effects of the addition of small amounts of Al to copper: Corrosion, resistivity, adhesion, morphology, and diffusion," J. Appl. Phys. 75(7), Apr. 1994, pp. 3627-3631.

T. Suwwan de Felipe et al., "Bias-temperature stability of the $Cu(Mg)/SiO_2/p-Si$ metal-oxide-semiconductor capacitors," J. Vac. Sci. Technol. B 15(6), Nov./Dec. 1997, pp. 1987-1986.

Chen et al. "Low Temperature Plasma-Assisted Chemical Vapor Deposition of Tantalum Nitride form Tantalum Pentabromide for Copper Metallization," Jan./Feb. 1999, J. Vac. Sci. Technol., B 17(1), pp. 182-185.

Cheng et al., "Directional Deposition of Cu into Semiconductor Trench Structures Using Ionized Magnetron Sputtering," Mar./Apr. 1995, J. Vac. Sci. Technol., B 13(2), pp. 203-208.

Cho et al., "Remote Plasma-Assisted Metal Organic Chemical Vapor Deposition of Tantalum Nitride Thin Films with Different Radicals," Dec. 1998, Jpn. J. Appl. Phys., vol. 37.

Endle et al., "X-Ray Photoelectron Spectroscopy Study on TiN Films Produced with Tetrakis (dimethylamido)Titanium and Selected N-Containing Precursors on $SiO_2$," May/Jun. 1998, J. Vac. Sci. Technol., A 16(3), pp. 1262-1267.

Green et al., "Determination of Flux Ionization Fraction Using a Quartz Crystal Microbalance and a Gridded Energy Analyzer in an Ionized Magnetron Sputtering System," Dec. 1997, Rev. Sci. Instrum., 68 (12), pp. 4555-4560.

Han et al., "Barrier Metal Properties of Amorphous Tantalum Nitride Thin Films Between Platnium and Silicon Deposited Using Remote Plasma Metal Organic Chemical Vapor Method," May 1998, Jpn. J. Appl. Phys., vol. 37 (1998), Pt. 1, No. 5A, pp. 2646-2651.

Hayden et al., "Characterization of Magnetron-Sputtered Partially Ionized Aluminum Deposition," Mar./Apr. 1998, J. Vac. Sci. Technol., A 16(2), pp. 624-627.

Hayden et al., "Helion Plasma Source for Ionized Physical Vapor Deposition," 1999, Surface and Coatings Technology, 120-121 (1999), pp. 401-404.

Lee et al., "The Failure Mechanism of MOCVD TiN Diffusion Barrier at High Temperature," 1996, Mat. Res. Soc. Symp. Proc., vol. 324, pp. 279-284.

Lucovsky et al., "Formation of Thin Fims by Remote Plasma Enhanced Chemical Vapor Deposition (Remote PECVD)," Feb. 1990, in Handbook of Plasma Processing Technology, eds. Rossnagel, Cuomo and Westwood, Noyes Publications, pp. 387-408.

Musher et al., Atmospheric Pressure Chemical Vapor Deposition of Titanium Nitride from Tetrakis (diethylamido) Titanium and Ammonia, Feb. 1996, J. Electochem. Soc., vol. 143, No. 2, pp. 736-744.

Peng et al., "Structural and Electrical Properties of Chemical Vapor Deposition Tungsten Overgrowth on Physical Vapor Deposited and Metalorganic Chemical Vapor Deposited TiNAdhesion Layers," Jul./Aug. 1998, J. Vac. Sci. Technol., B 16(4), pp. 2013-2018.

Reif, Rafael, Plasma Enhanced Chemical Vapor Deposition of Thin Films for Microelectronics, Feb. 1990, in Handbook of Plasma Processing Technology, eds: Rossnagel, Cuomo and Westwood, Noyes Publications, pp. 260-284.

Truong, C.M.; Chen, P.J.; Corneille, J.S.; Oh, W.S. and Goodman, D.W., "Low-Pressure Deposition of TiN Thin Films from a Tetrakis (diethylamido) Titanium Precursor," 1995, *J. Phys. Chem.*, 1995, 99, pp. 8831-8842.

Tsai et al., "Comparison of the Diffusion Barrier Properties of Chemical-Vapor-Deposited TaN and Sputtered TaN Between Cu and Si," May 1996, J. Appl. Phys., 79 (9), pp. 6932-6938.

Danek et al., "Barrier First Method for Single Damascene Trench Applications," Novellus Systems, Inc., U.S. Appl. No. 11/714,465, filed Mar. 5, 2007.

U.S. Office Action mailed Jul. 31, 2002, from U.S. Appl. No. 09/862,539.

U.S. Office Action mailed Sep. 16, 2002, from U.S. Appl. No. 09/776,704.

U.S. Office Action mailed Apr. 22, 2002, from U.S. Appl. No. 09/776,704.

U.S. Final Office Action mailed Apr. 3, 2003, from U.S. Appl. No. 09/816,847.

U.S. Office Action mailed Oct. 4, 2002, from U.S. Appl. No. 09/816,847.

U.S. Office Action mailed Oct. 23, 2002, from U.S. Appl. No. 09/965,472.

U.S. Office Action mailed Oct. 3, 2003, from U.S. Appl. No. 10/412,562.

U.S. Final Office Action mailed Mar. 23, 2006, from U.S. Appl. No. 10/804,353.

U.S. Office Action mailed Oct. 3, 2006, from U.S. Appl. No. 10/804,353.

U.S. Office Action mailed Aug. 28, 2002, from U.S. Appl. No. 09/975,612.

U.S. Office Action mailed Jun. 15, 2004, from U.S. Appl. No. 10/289,237.

U.S. Office Action mailed Dec. 19, 2002, from U.S. Appl. No. 10/121,949.

Klawuhn et al., "Apparatus and Methods for Deposition and/or Etch Selectivity," Novellus Systems, Inc., U.S. Appl. No. 11/558,693, filed Nov. 10, 2006.

Dulkin et al., "Deposition of Thin Continuous PVD Seed Layers Having Improved Adhesion to the Barrier Layer," Novellus Systems, Inc., U.S. Appl. No. 11/473,618, filed Jun. 22, 2006.

Dulkin et al., "Method and Apparatus for Controlling Sputtered Flux in PVD Sources," Novellus Systems, Inc., U.S. Appl. No. 11/564,222, filed Nov. 28, 2006.

Kailasam et al., "Resputtering Process for Eliminating Dielectric Damage," Novellus Systems, Inc., U.S. Appl. No. 11/588,586, filed Oct. 26, 2006.

Lu et al., "An Integrated Plasma Equipment-feature Scale Model for Ionized Metal Physical Vapor Deposition", Jun. 2000, University of Illinois (16 pages).

Font et al., "Scaling of Hollow Cathode Magnetrons for Metal Deposition", Oct. 1999, University of Illinois (20 pages).

Rozbicki et al., "Multistep Method of Depositing Metal Seed Layers," Novellus Systems, Inc., U.S. Appl. No. 11/701,984, filed Feb. 1, 2007.

Pradhan et al., "Atomic Layer Profiling of Diffusion Barrier and Metal See Layers," Novellus Systems, Inc., U.S. Appl. No. 11/807,179, filed May 24, 2007.

Juliano, D., "Selective Resputtering of Metal Seed Layers," Novellus Systems, Inc., U.S. Appl. No. 11/903,487, filed Sep. 21, 2007.

Vijayendran et al., "Gas Treatment Method and Apparatus to Improve Copper Gap Fill," U.S. Appl. No. 11/131,599, filed May 18, 2005.

Vyvoda et al., "Role of sidewall scattering in featuring profile evolution during $Cl_2$ and HBr plasma etching of silicon," J.Vac. Sci. Technol. B 18(2), Mar./Apr. 2000, pp. 820-833.

Hoekstra et al., "Microtenching resulting from specular reflection during chlorine etching of silicon," J.Vac. Sci. Technol. B 16(4), Jul./Aug. 1998, pp. 2102-2104.

Lane et al., "Feature evolution during plasma etching. II. Polycrystalline silicone etching," J. Vac. Sci. Technol. A 18(1), Jan./Feb. 2000, pp. 188-196.

Rozbicki R., "A Method of Enhancing Selectivity of Resputtering Process," Novellus Systems, Inc., U.S. Appl. No. 11/977,355, filed Oct. 23, 2007.

Pradhan et al., "Method and Apparatus for Increasing Local Plasma Density in Magnetically Confined Plasma," Novellus Systems, Inc., U.S. Appl. No. 11/807,182, filed May 24, 2007.

Kinder et al., "The Use of Ultra-High Magnetic Fields in Resputter and Plasma Etching," Novellus Systems, Inc., U.S. Appl. No. 11/807,183, filed May 24, 2007.

Dulkin et al., "Methods and Apparatus for Engineering and Interface Between a Diffusion Barrier Layer and a Seed Layer," Novellus Systems, Inc., U.S. Appl. No. 11/807,178, filed May 24, 2007.

Wu et al., "Deposition of Doped Copper Seed Layers Having Improved Reliability," Novellus Systems, Inc., U.S. Appl. No. 12/122,118, filed May 16, 2008.

U.S. Office Action mailed Jun. 26, 2008, from U.S. Appl. No. 11/473,618.

U.S. Office Action mailed May 2, 2008, from U.S. Appl. No. 11/558,693.

U.S. Office Action mailed Dec. 12, 2008, from U.S. Appl. No. 11/714,465.

Notice of Allowance and Fee Due mailed Nov. 24, 2008, from U.S. Appl. No. 11/558,693.

Allowed Claims from U.S. Appl. No. 11/558,693.

U.S. Final Office Action mailed Dec. 10, 2008, from U.S. Appl. No. 11/473,618.

U.S. Office Action mailed Nov. 14, 2008, from U.S. Appl. No. 11/701,984.

Notice of Allowance and Fee Due mailed Apr. 13, 2004, from U.S. Appl. No. 10/412,562.

Allowed Claims from U.S. Appl. No. 10/412,562.

Notice of Allowance and Fee Due mailed Oct. 3, 2006, from U.S. Appl. No. 10/804,353.

Allowed Claims from U.S. Appl. No. 10/804,353.

Wu et al., "Methods and Apparatus for Depositing Titanium Based Diffusion Barrier Films," Novellus Systems, Inc., U.S. Appl. No. 12/154,984, filed May 28, 2008.

U.S. Office Action mailed on Mar. 6, 2009 for U.S. Appl. No. 11/903,487.

U.S. Office Action mailed on Feb. 23, 2009 for U.S. Appl. No. 11/701,984.

U.S. Office Action mailed on Mar. 24, 2009 for U.S. Appl. No. 11/473,618.

U.S. Office Action mailed on May 5, 2009 for U.S. Appl. No. 11/588,586.

U.S. Office Action mailed on May 26, 2009 for U.S. Appl. No. 11/564,222.

U.S. Final Office Action mailed Jun. 17, 2009 for U.S. Appl. No. 11/701,984.

U.S. Office Action mailed Jul. 23, 2009 for U.S. Appl. No. 12/122,118.

U.S. Office Action mailed Aug. 3, 2009 for U.S. Appl. No. 11/714,465.

Shaviv et al., "Conformal Films on Semiconductor Substrates" Novellus Systems, Inc., U.S. Appl. No. 12/467,200, filed May 15, 2009.

U.S. Office Action for U.S. Appl. No. 12/154,984, mailed Oct. 6, 2009.

D'Couto et al. J. Vac. Sci. Technol. B. 2001, 19(1), pp. 244-249.

U.S. Final Office Action for U.S. Appl. No. 11/588,586 mailed Nov. 4, 2009.

Rozbicki et al., "Multistep Method of Depositing Metal Seed Layers" Novellus Systems, Inc., U.S. Appl. No. 12/699,738, filed Feb. 3, 2010.

U.S. Office Action mailed Feb. 4, 2010 for U.S. Appl. No. 11/807,179.

U.S. Office Action mailed Mar. 2, 2010 for U.S. Appl. No. 11/807,182.

U.S. Office Action mailed Mar. 5, 2010 for U.S. Appl. No. 11/807,178.

U.S. Notice of Allowance mailed Mar. 8, 2010 and Allowed Claims for U.S. Appl. No. 11/714,465.

U.S. Final Office Action mailed Mar. 11, 2010 for U.S. Appl. No. 12/122,118.

U.S. Final Office Action mailed Apr. 15, 2010 for U.S. Appl. No. 12/154,984.

U.S. Office Action mailed May 12, 2010 for U.S. Appl. No. 11/807,183.

Danek et al., "Barrier First Method for Single Damascene Trench Applications," Novellus Systems, Inc., U.S. Appl. No. 12/764,870, filed Apr. 21, 2010.

Notice of Allowance and Allowed Claims mailed Mar. 24, 2010, for U.S. Appl. No. 11/588,586.

U.S. Office Action mailed Jul. 30, 2010 for U.S. Appl. No. 12/122,118.

Notice of Allowance mailed Jul. 27, 2010 and Allowed Claims for U.S. Appl. No. 11/807,179.

Notice of Allowance mailed Aug. 2, 2010 and Allowed Claims for U.S. Appl. No. 11/731,737.

U.S. Final Office Action mailed Sep. 14, 2010 for U.S. Appl. No. 11/807,182.

Notice of Allowance mailed Nov. 1, 2010 and Allowed Claims for U.S. Appl. No. 11/807,183.

U.S. Final Office Action mailed Nov. 15, 2010 for U.S. Appl. No. 12/122,118.

Notice of Allowance mailed Nov. 30, 2010 and Allowed Claims for U.S. Appl. No. 11/807,182.

Pradhan et al., "Method and Apparatus for Increasing Local Plasma Density in Magnetically Confined Plasma," Novellus Systems, Inc., U.S. Appl. No. 13/033,349, filed Feb. 23, 2011.

Pradhan et al., "Atomic Layer Profiling of Diffusion Barrier and Metal See Layers," Novellus Systems, Inc., U.S. Appl. No. 12/910,623, filed Oct. 22, 2010.

U.S. Office Action for U.S. Appl. No. 12/764,870 mailed Apr. 14, 2011.

* cited by examiner

METHODS AND APPARATUS FOR RESPUTTERING PROCESS THAT IMPROVES BARRIER COVERAGE

CROSS-REFERENCE TO RELATED APPLICATIONS

This application is a continuation-in-part claiming priority under 35 USC 120 from U.S. patent application Ser. No. 11/588,586 filed Oct. 26, 2006, titled "Resputtering Process for Eliminating Dielectric Damage", naming Rozbicki et al. as inventors, which is a continuation-in-part claiming priority under 35 USC 120 from U.S. patent application Ser. No. 10/804,353 filed Mar. 18, 2004, titled "Barrier First Method For Single Damascene Trench Applications," naming Rozbicki et al. as inventors, which is a continuation-in-part claiming priority under 35 USC 120 from U.S. patent application Ser. No. 10/412,562 filed Apr. 11, 2003 (now U.S. Pat. No. 6,764,940), which is a continuation-in-part claiming priority under 35 USC 120 from U.S. patent application Ser. No. 09/965,472 filed Sep. 26, 2001 (now U.S. Pat. No. 6,607,977), which claims benefit of prior U.S. Provisional Application No. 60/275,803 filed Mar. 13, 2001. U.S. Pat. No. 6,764,940 also claims benefit of U.S. Provisional Patent Application No. 60/379,874 filed May 10, 2002. Each of these references is incorporated herein by reference in its entirety for all purposes.

FIELD OF THE INVENTION

The present invention pertains to methods of resputtering layers of material on a partially fabricated integrated circuit. The methods are particularly useful for resputtering diffusion barrier layers and copper seed layers. The methods can also be applied for resputter etch back of other wafer materials, such as conductive lines.

BACKGROUND OF THE INVENTION

Damascene processing is a method for forming metal lines on integrated circuits. It involves formation of inlaid metal lines in trenches and vias formed in a dielectric layer (inter metal dielectric). Damascene processing is often a preferred method because it requires fewer processing steps than other methods and offers a higher yield. It is also particularly well-suited to metals such as copper that cannot be readily patterned by plasma etching. In order to frame the context of this invention, a brief description of a Damascene process for forming a partially fabricated integrated circuit is described below.

A typical Damascene process flow begins with a dielectric into which recessed features have been etched. A diffusion barrier layer, followed by a metal layer are laid upon the dielectric. The metal layer is typically composed of copper or aluminum. The metal layer fills in the recessed features and forms conductive paths for the resulting IC device.

The barrier layer is important because metal ions from the conductive paths may otherwise diffuse into the silicon devise and the dielectric layer. Suitable materials for the diffusion barrier layer include tantalum, tantalum nitride, tungsten, titanium, titanium nitride, and the like. The barrier may be formed by a physical vapor deposition (PVD) process such as sputtering or a chemical vapor deposition (CVD) process. During the deposition process, etching of the diffusion barrier layer may be carried out on certain portions of the substrate to achieve optimal coverage.

Chemical-mechanical planarization (CMP) is employed to eliminate excess metal from the top of the dielectric and to create a flat top surface. CMP also removes the diffusion barrier layer on the field region.

This process can be repeated to create a multilayered IC device.

SUMMARY OF THE INVENTION

The present invention provides methods and apparatus for a resputtering process that improves coverage on a semiconductor substrate having recessed features. The present invention involves resputtering under a pressure sufficient to cause momentum transfer reflection of the resputtered material. The reflection causes some of the resputtered material to be deposited in a recessed feature. Previous techniques for depositing material in recessed features used the material inefficiently. The methods and apparatus described herein conserve deposition material and improve selectivity.

By effectively increasing the concentration or density of plasma and neutral species proximate to the semiconductor substrate, one creates a minor or reflector which reflects a fraction of surface sputtered barrier species back onto the substrate surface to thereby prevent their loss. Of particular importance, some fraction of the barrier sputtered from the field region is reflected into recessed features such as trench and via sidewalls on the substrate surface.

One aspect of the claimed invention pertains to various methods for depositing material on a semiconductor wafer substrate having field regions and recessed features. In one embodiment the method comprises a depositing operation and a resputtering operation. The depositing operation involves depositing a layer of the material on at least a portion of the field regions of the wafer. The depositing operation may comprise sputtering the material using iPVD (ionized PVD). The material being deposited may be diffusion barrier material or copper. The material may comprise at least one of Ta, $TaN_x$, Ti, $TiN_x$, W, $WN_x$, Ru and Co. The resputtering operation involves resputtering at least the layer residing on the field region of the wafer. The resputtering operation is carried out by impinging the layer with high energy particles under a pressure that is sufficient to cause momentum transfer reflection of the resputtered material, so that at least some of the reflected material is deposited in the recessed features of the substrate. The resputtering operation may result in at least about 10%, e.g., at least about 20% of the resputtered material being reflected onto the wafer. The recessed features may comprise vias or trenches, and may be in a low-k dielectric layer.

The resputtering operation may also comprise resputtering material residing in bottom portions of the recessed features of the wafer, wherein such resputtering results in net etching of the material residing in bottom portions of at least some of the recessed features. In this case, where the recessed features comprise a via and/or a trench, the net etching rate in the via bottom may be 1.2 times greater than the net etching rate in the trench bottom. In some embodiments, such resputtering may result in a net deposition in the bottom portions of at least some of the recessed features of the wafer.

Resputtering of the material residing in the bottom portions of the recessed features may also involve etching copper to form an anchor region in a layer of copper residing underneath at least some of the recessed features. The anchors may generally have a smooth rounded profile. In certain embodiments, the anchors may on average be formed at a depth of between about 10 and 600 Å.

The depositing and resputtering operations may be performed in the same process chamber. In one embodiment, the process chamber comprises a hollow cathode magnetron (HCM). The process chamber may comprise a planar magnetron. The depositing and resputtering operations may also be performed in an apparatus that does not have an ICP source.

The depositing and resputtering operations may also be performed in different process chambers. In this situation, resputtering may be performed in an apparatus that does not include a sputter target.

In one embodiment, the resputtering operation comprises redistributing material on the processed semiconductor substrate without substantially depositing additional material originating from a source that is extraneous to the processed semiconductor substrate. In embodiments where additional material is contributed from an extraneous source during resputter, the additional material may be deposited at a rate of less than about 5 Å/sec, where the deposition rate is measured in the field region. The extraneous source of material may be a sputter target or a sputter coil or both.

In some embodiments, the depositing and resputtering operations are repeated at least once. This facilitates precise contouring of the barrier deposited on the feature walls and/or smooth profiling of the anchor. The pressure used in the resputtering operation may be between about 2 and 100 mTorr. In certain embodiments, the pressure may be about 20-60 mTorr. In those embodiments where the depositing and resputtering operations are performed in one chamber, the depositing operation may be performed at a pressure of less than 10 mTorr.

As indicated, some embodiments of the claimed invention pertain to a method of redistributing material on a semiconductor wafer substrate having a field region and recessed features. In one embodiment the method comprises a resputtering operation in which high energy particles bombard a layer of material residing on the field region of the wafer under a pressure that is sufficient to cause momentum transfer reflection of at least some of the resputtered material, so that the resputtered material is deposited in the recessed features of the substrate.

Some embodiments of the claimed invention pertain to an apparatus for depositing material on a semiconductor wafer substrate having a field region and recessed features. In one embodiment, the apparatus comprises a process chamber having a target for sputtering the material onto the semiconductor wafer, a wafer support for holding the wafer in position during deposition of the material, and a controller comprising program instructions for controlling a sputtering operation. The sputtering operation involves sputtering material from a target onto the semiconductor wafer under conditions that coat at least a portion of the field region, resulting in the formation of a layer of the material. The sputtering operation further comprises subsequently resputtering the layer under a pressure that is sufficient to cause momentum transfer reflection of at least some of the resputtered material (typically a significant fraction of the resputtered material), so that the resputtered material is deposited in the recessed features of the substrate.

In some embodiments, the controller may further comprise instructions for generating a plasma comprising ionized material sputtered from the target. The target may comprise a metal for forming a diffusion barrier on the semiconductor wafer. The diffusion barrier may comprise at least one of Ta, $TaN_x$, Ti, $TiN_x$, W, $WN_x$, Ru and Co.

In certain embodiments, the target comprises a metal for forming a seed layer on the semiconductor wafer. In some of these embodiments, the process chamber comprises an HCM. The process chamber may alternatively comprise a planar magnetron. The controller may further comprise program instructions for repeating the sputtering operation at least once. The instructions for resputtering the layer may comprise instructions for operating at a pressure of about 40-60 mTorr.

Some embodiments of the claimed invention pertain to an apparatus that comprises two elements. The first element is a process chamber having a wafer support for holding the wafer in position during resputtering of the material. The second element is a controller comprising program instructions for a resputtering operation. The resputtering operation involves resputtering a layer of material residing in a field region under a pressure that is sufficient to cause momentum transfer reflection of at least some of the resputtered material, so that the reflected resputtered material is deposited in the recessed features of the substrate.

These and other features and advantages of the present invention will be described in more detail below with reference to the associated drawings.

DETAILED DESCRIPTION OF PREFERRED EMBODIMENTS

Introduction

Resputtering is a plasma-based process that results in the etching of material from the wafer surface. Resputtering methods that can be integrated into deposition process flows for diffusion barrier layers are herein described. Such methods involve resputtering material on at least the field regions of the wafer under a sufficiently high level of pressure. The material may be, for example, diffusion barrier material or conductive material, such as copper. Diffusion barrier materials include but are not limited to Ta, TaN, W and Ti. At sufficiently high levels of pressure, some resputtered material, through momentum transfer reflection, is reflected into a recessed feature. Such methods offer several advantages, including more efficient utilization of deposition material and improved selectivity.

These methods can be used in a variety of applications that require deposition of layers on a substrate having recessed features. These methods are particularly suitable for IC fabrication, and will be illustrated in the context of a copper dual Damascene processing. It is understood, that these methods can be used in other processing methods, including single Damascene processing, and can be applied to the deposition, etching and redistribution of a variety of materials.

In order to frame the context of this invention, a brief description of a copper dual Damascene process for forming a partially fabricated integrated circuit is described below. As noted, the invention applies to other fabrication processes including single Damascene processes.

Figure 1A:
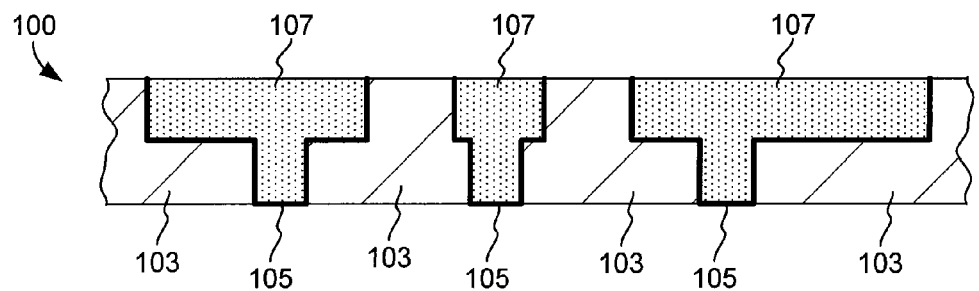
FIGS. 1A-1H show cross sectional depictions of device structures created during a copper dual Damascene fabrication process.
Figure 1B:
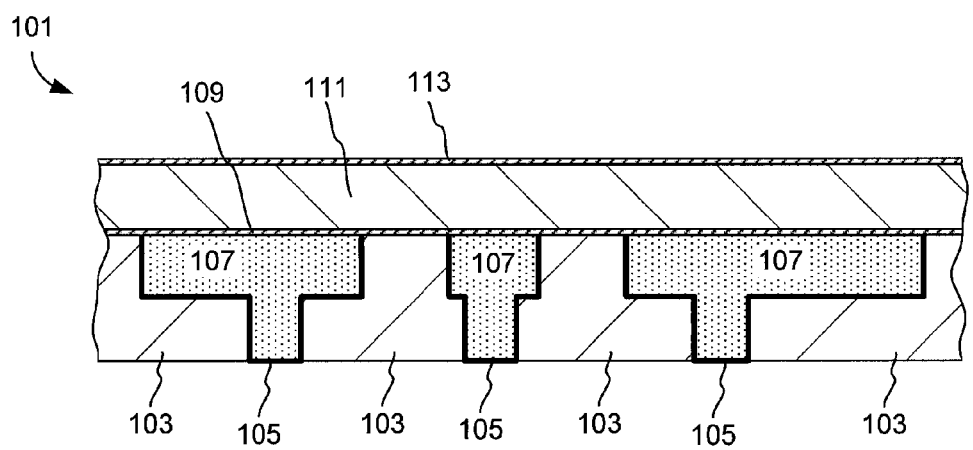
Figure 1C:
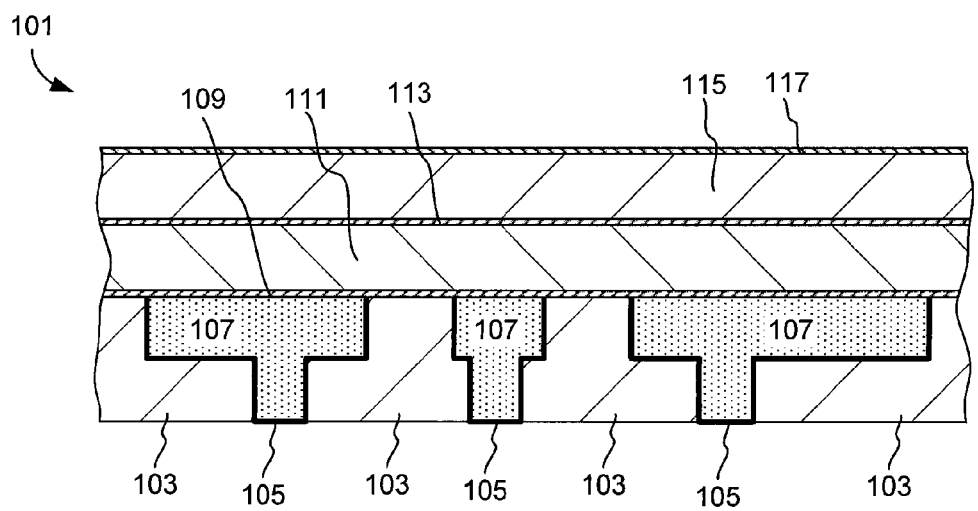
Figure 1D:
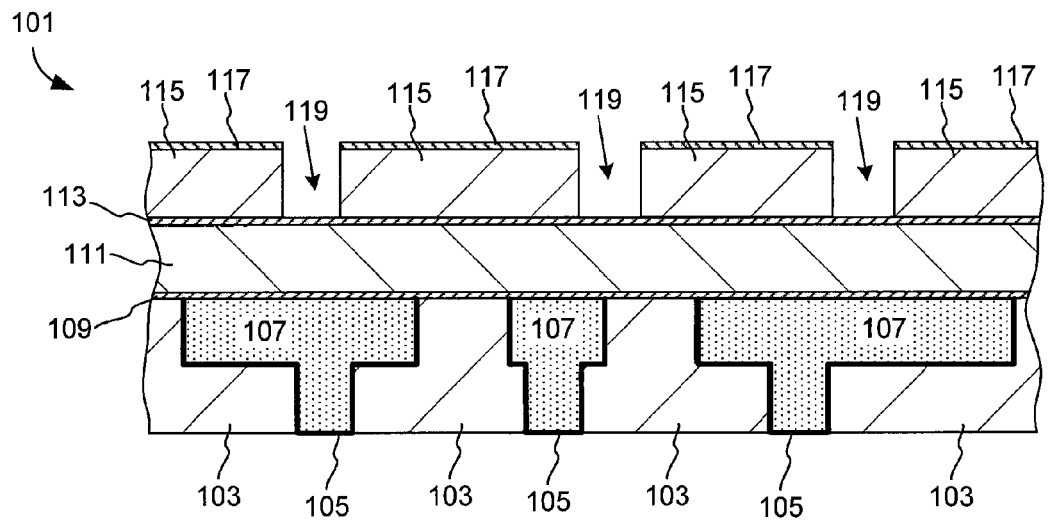
Figure 1E:
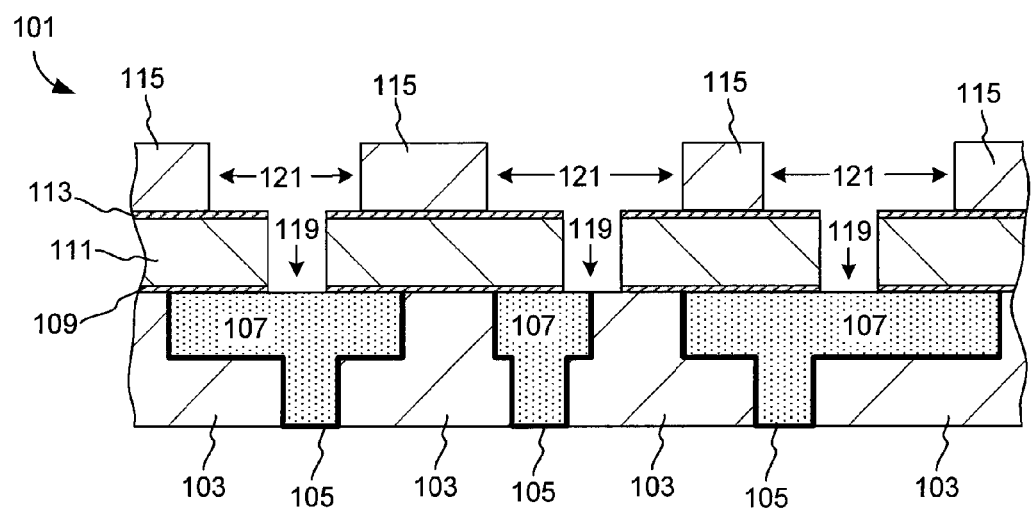
Figure 1F:
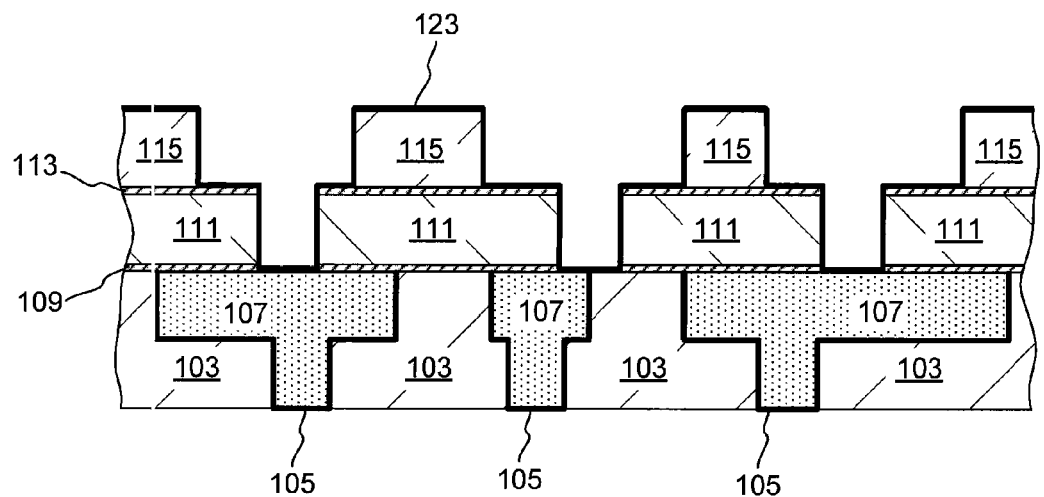
Figure 1G:
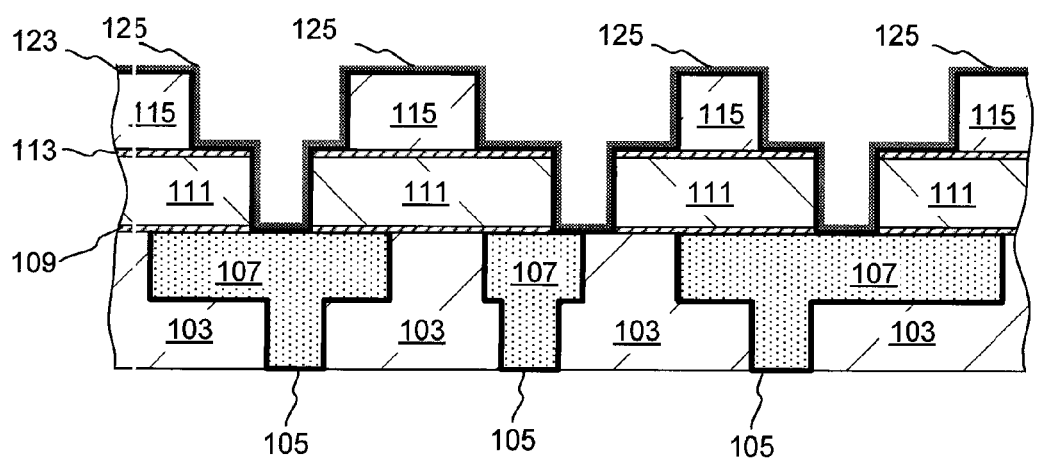
Figure 1H:
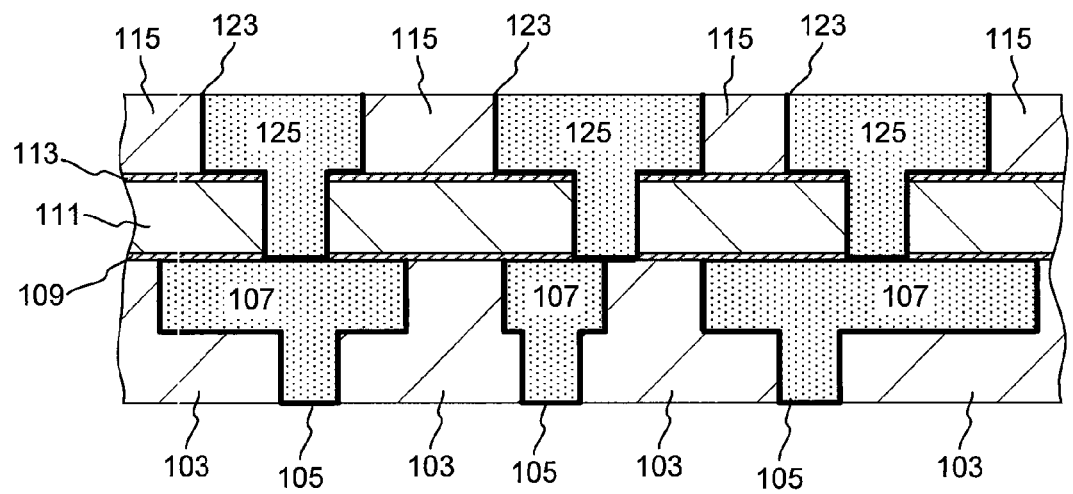

Presented in FIGS. 1A-1H, is a cross sectional depiction of device structures created at various stages of a dual Damascene fabrication process. A cross sectional depiction of a completed structure created by the dual Damascene process is shown in FIG. 1H. Referring to FIG. 1A, an example of a typical substrate, 100, used for dual Damascene fabrication is illustrated. Substrate 100 includes a pre-formed dielectric layer 103 (such as fluorine or carbon doped silicon dioxide or organic-containing low-k material) with etched line paths (trenches and vias) in which a diffusion barrier 105 has been deposited followed by inlaying with copper conductive routes 107. Resputtering methods described herein may be integrated into the depositing of the diffusion layer. Because copper or other mobile conductive material provides the conductive paths of the semiconductor wafer, the underlying silicon devices must be protected from metal and metal ions (e.g., $Cu^{2+}$) that might otherwise diffuse or drift into the silicon. Suitable materials for diffusion barrier 105 include tantalum, tantalum nitride, tungsten, titanium tungsten, titanium nitride, tungsten nitride, cobalt, ruthenium and the like. In a typical process, barrier 105 is formed by a physical vapor deposition (PVD) process such as sputtering, a chemical vapor deposition (CVD) process, or an atomic layer deposition (ALD) process. Typical metals for the conductive routes are aluminum and copper. More frequently, copper serves as the metal in Damascene processes, as depicted in these figures. The resultant partially fabricated integrated circuit 100 is a representative substrate for subsequent Damascene processing, as depicted in FIGS. 1B-1F.

As depicted in FIG. 1B, a diffusion barrier 109 of, e.g., silicon nitride or silicon carbide is deposited to encapsulate conductive routes 107. Next, a first dielectric layer, 111, of a dual Damascene dielectric structure is deposited on diffusion barrier 109. This is followed by deposition of an etch-stop layer 113 (typically composed of silicon nitride or silicon carbide) on the first dielectric layer 111.

The process follows, as depicted in FIG. 1C, where a second dielectric layer 115 of the dual Damascene dielectric structure is deposited in a similar manner to the first dielectric layer 111, onto etch-stop layer 113. Deposition of an antireflective layer 117, e.g., a silicon oxynitride or a nitrogen-free material, follows.

The dual Damascene process continues, as depicted in FIGS. 1D-1E, with etching of vias and trenches in the first and second dielectric layers. First, vias 119 are etched through antireflective layer 117 and the second dielectric layer 115. Standard lithography techniques are used to etch a pattern of these vias. The etching of vias 119 is controlled such that etch-stop layer 113 is not penetrated. As depicted in FIG. 1E, in a subsequent lithography process, antireflective layer 117 is removed and trenches 121 are etched in the second dielectric layer 115; vias 119 are propagated through etch-stop layer 113, first dielectric layer 111, and diffusion barrier 109.

Next, as depicted in FIG. 1F, these newly formed vias and trenches are, as described above, coated with a diffusion barrier 123. As mentioned above, barrier 123 is made of tantalum, or other materials that effectively block diffusion of copper atoms into the dielectric layers. Methods described herein can be used to improve the deposition of the barrier 123.

In some embodiments, after diffusion barrier 123 is deposited, a seed layer of copper is applied (typically a PVD process) to enable subsequent electrofilling of the features with copper inlay in some embodiments. FIG. 1G depicts a copper seed layer 125 deposited on top of the diffusion barrier layer 123. The seed layer should preferably be continuous and should conformally coat the recessed features in order to support an electrofill process. Preferably, thickness of seed layer coverage should not significantly fluctuate depending on its position on the wafer. In some embodiments, it is often desirable to obtain a continuous seed layer that will have substantially the same thickness in the field, on the bottom portions of the recesses and on the sidewalls. Further, various corners within the recesses should be adequately coated by the seed metal. Methods provided herein allow deposition of seed layers with improved coverage, and result in formation of IC devices having increased reliability.

After the seed layer has been deposited, the recesses are electrofilled with copper. During electrodeposition of copper, the seed layer residing on the wafer serves as a cathode with an electrical contact being made at the edge of the wafer. In those cases when the seed layer is very thin, the sheet resistance of the seed layer is usually substantial. Electroplating on a layer with high sheet resistance gives rise to a terminal effect, in which greater amounts of copper are plated in the vicinity of the electrical contact. Terminal effect leads to increased deposition of metal at the wafer edge and to decreased deposition at the wafer center. Such non-uniformity is undesirable, and should be avoided when possible. While in some cases seed layers should be thin to serve their function, in other cases seed layers may contain inadvertently formed thin portions, which may unnecessarily exacerbate the terminal effect. It is therefore important, to avoid deposition of unnecessarily thin seed layers. Methods described herein allow good seed layer coverage in the field, throughout the radius of the wafer, in the recess bottoms, and on the sidewalls, thereby leading to smaller terminal effects during plating.

After copper has been electrodeposited, excess copper is removed from the field by, for example, chemical mechanical polishing (CMP). FIG. 1H shows the completed dual Damascene structure, in which copper conductive routes 127 are inlayed (seed layer not depicted) into the via and trench surfaces over barrier 123.

Copper routes 125 and 107 are now in electrical contact and form conductive pathways, as they are separated only by diffusion barrier 123, which is also somewhat conductive. Traditionally these diffusion barriers are deposited using PVD methods because of the high quality resultant films. When depositing in features with higher aspect ratios such as the narrow vias within modern technologies, PVD methods tend to produce films with poor sidewall coverage and thick bottom coverage. Sidewall coverage, however, can be improved by etching material from the bottom of the via and redistributing it to the sidewalls.

Resputtering

The etch-back of the barrier layer can be accomplished by a technique known as the resputter process. As explained below, resputtering may take place in the same chamber as the PVD, or frequently the iPVD, process and employ similar process conditions. In this process ionic species are directed towards the wafer and upon collision with the wafer surface, resputtering of the wafer material occurs. In certain embodiments, the ions are formed by ionization of the process gas in the iPVD magnetron chamber. In some embodiments, there may be a component of ionized metal in addition to ionized process gas resputtering wafer material. Commonly employed process gases are inert gases such as argon and krypton. The resputtering process is typically carried out at temperatures of up to 500° C. When the provided methods are used for copper seed layer deposition, the temperature typically ranges from about −40 degrees C. to 100 degrees C.). The traditionally used pressure for resputtering is less than 10 mTorr, preferably from 2 to 5 mTorr.

The resputtering process is most often used for resputtering of the diffusion barrier layer, but can also be employed in the etch-back or redistribution of other wafer materials such as conductive metal layers; e.g., copper seed layers. Diffusion barrier materials commonly subjected to resputtering include but are not limited to tantalum, titanium, tungsten, ruthenium, cobalt, solid solutions of these metals and nitrogen and binary nitrides (e.g. $TaN_x$, $TiN_x$, $WN_x$). Copper and copper alloys are also a commonly resputtered material, including copper from underlying metallization layers as produced during anchoring. In the first metallization layer, some underlying tungsten or other interconnect material may also be resputtered.

Figure 2:
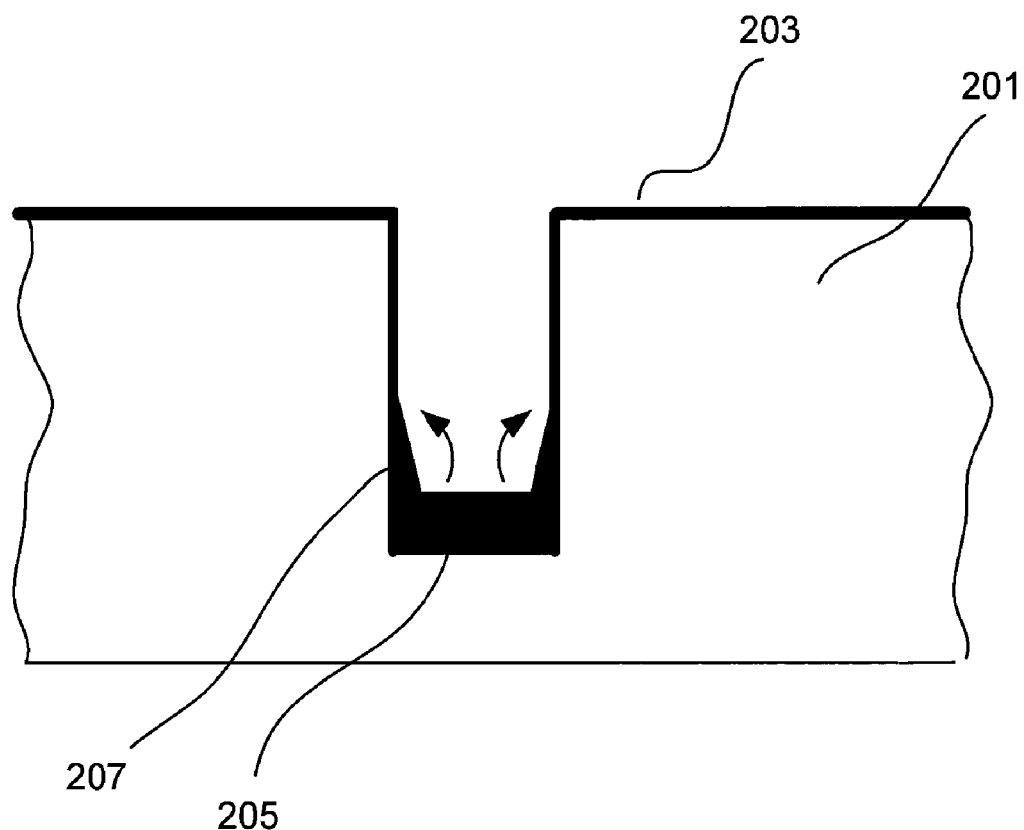
FIG. 2 shows a cross-sectional depiction of a recessed feature illustrating sputtering of the barrier layer from the recessed feature bottom.

In high aspect ratio recesses resputter leads to removal of some or all of the barrier layer at the bottom of the recess, while covering the sidewalls of the recess with the resputtered material. This can be advantageous because sidewalls are sometimes insufficiently covered during the basic PVD or iPVD process. FIG. 2 illustrates the resputter process in a high aspect ratio via. A cross-sectional view of the wafer portion is shown. The depicted via lies in the dielectric layer 201, and a diffusion barrier layer 203 covers the dielectric layer both in the field and in the via. Note the significant accumulation of the diffusion barrier material in the bottom of the via 205. During resputter process the energetic ions impinge on the bottom of the via, resulting in the barrier material atoms being sputtered onto the sidewalls 207, as illustrated by the arrows in FIG. 2. The net result of this process is the removal of the material from the bottom of the via and its deposition on the via sidewalls 207.

An important characteristic of iPVD processes and resputtering is the etch rate to deposition rate ratio (E/D). At the E/D ratio of 1 no net deposition or etching is occurring. At the E/D ratio of 0, the process is entirely depositing. At E/D ratios of more than 1 etching predominates, this being characteristic of resputter. Etching is the result of inert gas ions and/or metal ions impinging the wafer surface with sufficient momentum to dislodge material, while deposition is generally the result of inert gas ions bombarding the target and sputtering target material (neutral or ionic) onto the wafer surface.

The E/D ratio is not necessarily the same in different features (or feature depths) of the wafer. For example, the E/D ratio in the field, in the trench, and in the via may have different values. These values usually correlate with the aspect ratio of the feature, being the largest in the highest aspect ratio recesses and decreasing as the aspect ratio decreases. Therefore, it is frequently possible to have net deposition in the field region (E/D<1) and net etch at the via bottom (E/D>1). E/D ratios are not equal due to the difference in deposition rate (D) between field, trench and via. If there's no deposition, then it's believed that E(field)=E(trench)=E (via). While conventionally, the deposition component (D) came from an extrinsic source, such as target and coil, in the provided methods the source of deposition component may include the material sputtered from the wafer itself.

The relative amount of etching versus deposition can be controlled by modulating the power at the target and at the wafer pedestal. For example, to achieve the high E/D ratio needed for resputter, the power at the target is decreased while the power at the wafer pedestal (bias) is increased. This results in higher sputtering rate at the wafer compared to the target. Commonly employed DC target power for the resputter process is 1-8 kW, preferably 1-6 kW. The bias power for resputtering can range from about 100 to about 3000 W, preferably from about 600 to about 1500 W, and even more preferably from about 900 to about 1200 W. Conversely, if the power at the target is increased and the bias at the wafer is decreased or turned off, the target is sputtered at a high rate compared to the wafer, resulting in a high deposition rate. The DC target power used for deposition step ranges from 10 to 60 kW, preferably 20-35 kW, and more preferably 20-30 kW. The bias power during deposition can range from about 0 to about 3000 W, more preferably from about 500 to about 1200 W.

During a conventional resputter, the power at the target and the bias are tuned in such a way as to obtain net etching in desired areas. This translates into an E/D>1 in the bottom of the feature or features where resputtering is desired, e.g. the lowest lying feature on the wafer or in some cases the feature having the highest aspect ratio. Commonly, E/D ratio during resputter can reach values of up to about 1.5.

Even though such modulation can result in net etching in certain parts of the wafer, previous resputter techniques nevertheless have deposition and etching occurring simultaneously. This occurs in part because of the need to achieve net etching in certain portions of the wafer while protecting other portions. Etching, as noted earlier, can be used to remove the diffusion barrier at the bottom of a via, so that a connection can be made with an underlying conductive link. If only etching without any deposition took place, however, other recesses might lose their barrier layers as well, which may be undesirable. Combining the etching and deposition processes makes use of the fact that the E/D ratio differs in different locations of the wafer and helps to limit net etching to desirable areas, such as trench bottoms.

Resputtering in a regime where etching and deposition processes are occurring simultaneously, however, is wasteful of target material. Over 90% of the material deposited on the wafer is lost to the field, where it is later removed by CMP in certain embodiments. Only a very small fraction reaches the recesses. The methods described herein may be used to minimize the deposition component derived from sources extraneous to the wafer. Some embodiments allow for the shifting of barrier material from the field into the recesses. In some embodiments a hardware source of barrier material, such as a target or coil, is unnecessary during resputter, or at least the consumption of the target or coil is greatly reduced.

Figure 3A:
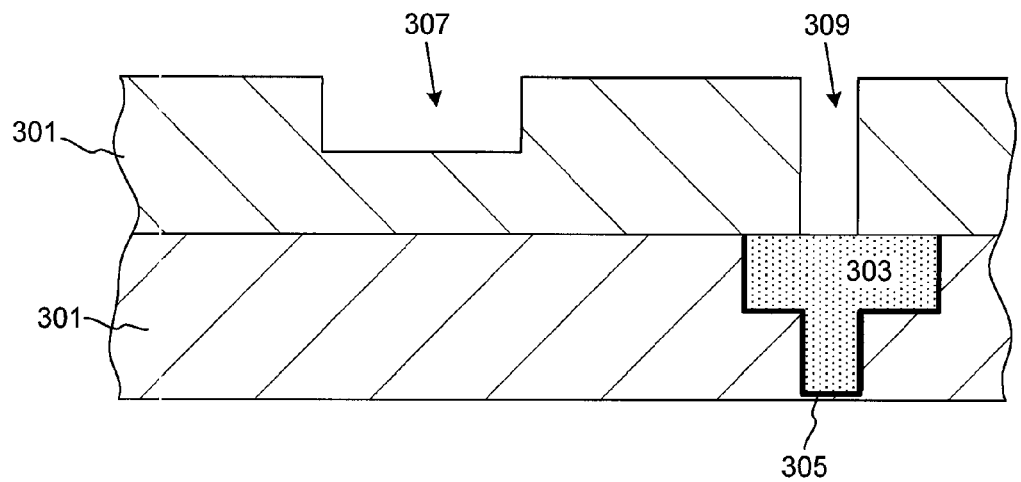
FIGS. 3A-3D show cross-sectional depictions of structures created during a conventional resputter process.

A conventional resputter process is depicted in FIGS. 3A-3D. Referring to FIG. 3A, a cross-sectional depiction of a wafer substrate is shown. The substrate comprises two layers of dielectric 301, where the top layer is patterned with two recesses, a trench 307, and a via 309. The dielectric 301 may be a low-k dielectric such as carbon doped silicon dioxide, hydrogenated silicon oxycarbide (SiCOH), fluorine doped silicon dioxide, or organic-containing low-k dielectric. Any of these materials may be employed in a porous or non-porous state. A conductive line 303 resides in the underlying dielectric layer directly below the via 309. Together line 303 and its coplanar dielectric and other coplanar lines serve as a metallization layer. Conductive lines are most commonly copper lines. The sides and the bottom of the copper line are coated with a diffusion barrier layer 305, which prevents the diffusion of copper into the dielectric layer 301. Etch-stop and antireflective layers, such as 313 and 317 of FIG. 2B, are not shown for clarity.

Figure 3B:
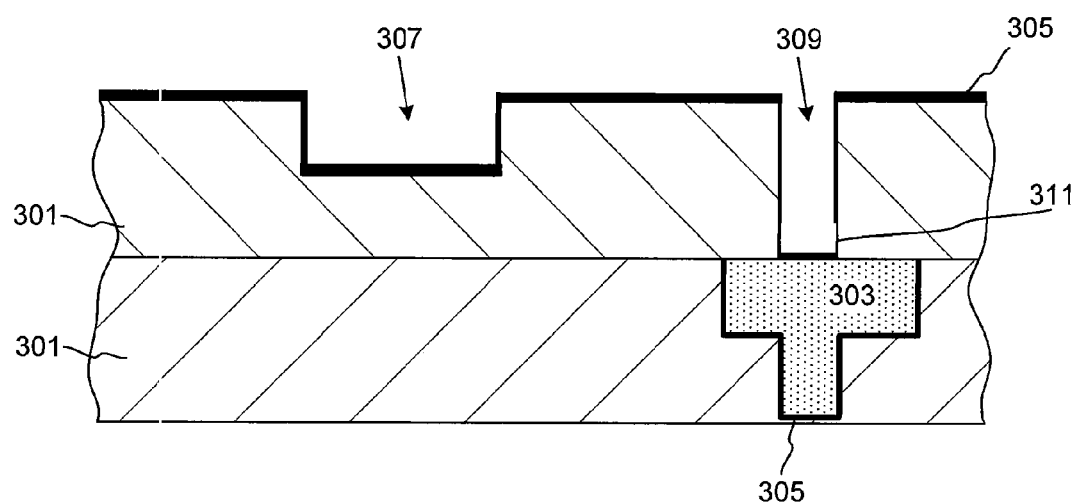

The exposed surface of the dielectric layer 301 is subjected to a diffusion barrier deposition step resulting in the structure shown in FIG. 3B. It can be seen that after the deposition step diffusion barrier layer 305 covers the surface of top dielectric layer both in the field and in the recesses. The uniformity of such coverage, however, is low, particularly in the via region. There is significant accumulation of the barrier material in the via bottom 311, and a very thin coverage of the via sidewalls.

Figure 3C:
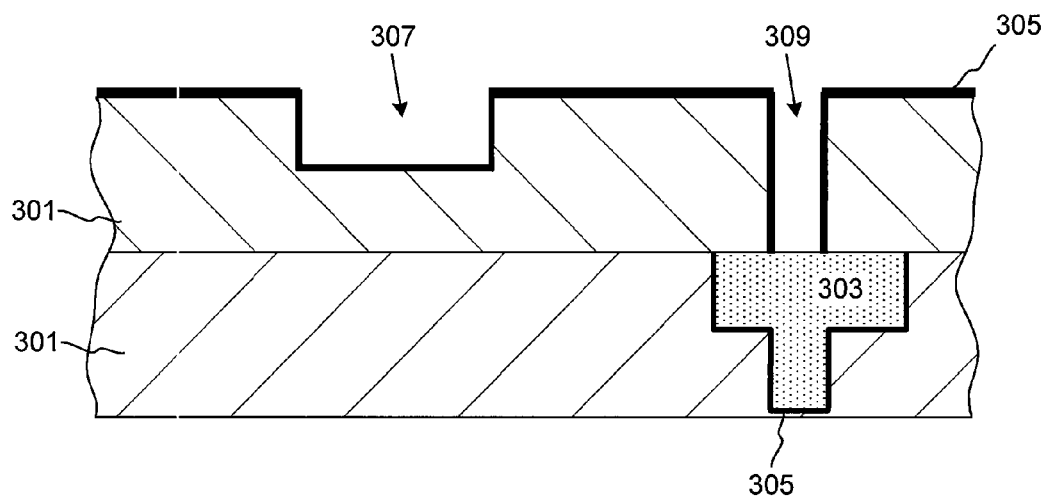

Uniformity of the via coverage is improved through the resputter step, which leads to the structure shown in FIG. 3C. In this structure all or a major fraction of the barrier material is resputtered from the via bottom onto the sidewalls exposing the underlying copper line. The desired result of this operation is a better, more uniform coverage of the sidewalls in the via and the trench.

Figure 3D:
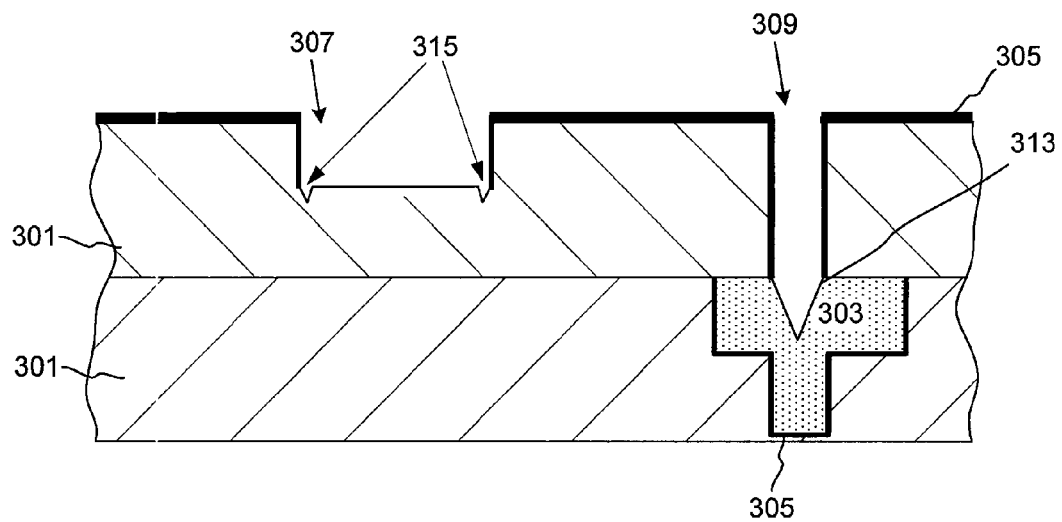

When resputtering is performed further, it etches material of the copper line (after the barrier material is removed) which resides below the via, leading to formation of a cavity in the conductive line, known as an anchor. The structure with an anchor 313 is shown in FIG. 3D. In certain embodiments, the anchor is a desired feature in the fabrication of an IC device which results in mechanically strong and highly conductive pathways when the via is filled with interconnect metal. At the same time, resputtering leads to undesired and unintentional changes in the trench region. The bottom of the trench may be stripped of the barrier layer, and the dielectric may become exposed to the impact of high-energy ions. The erosion of the barrier layer in the trench is an unintended consequence of such resputtering and is considered to be undesirable. For example, microtrenches 315 can form at the bottom corners of recesses when energetic ions of resputtering plasma strike particular regions on the exposed dielectric, e.g., after reflection from recess sidewall. When the diffusion barrier is thinned or removed at a trench bottom, a follow up deposition step is needed to provide some minimal coverage at the via bottom before copper seed can be applied.

Figure 4A:
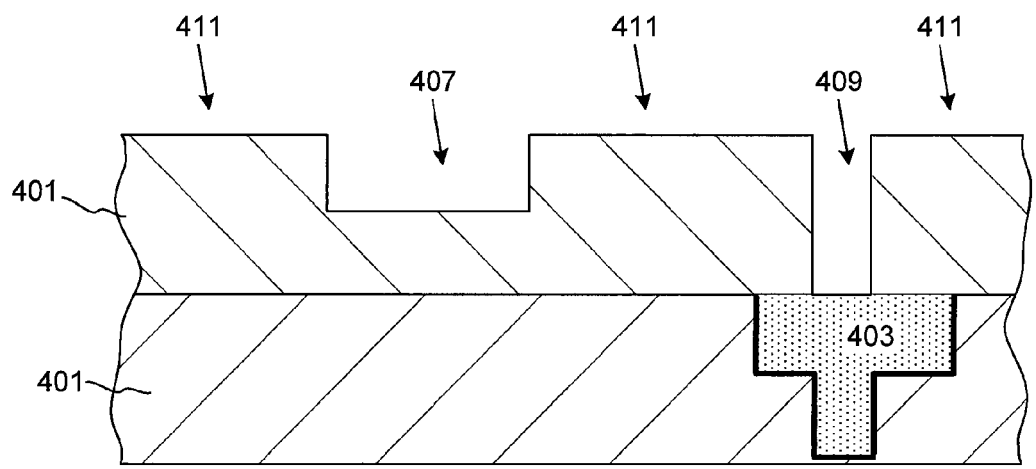
FIGS. 4A-4F show cross-sectional depictions of structures created during a low-pressure resputter process as compared to a resputter process where the pressure is sufficiently high to induce momentum transfer reflection of the resputtered material.

Some of the methods described herein can offer increased protection to trenches that would normally be subject to such erosion. FIGS. 4A-4F compare a conventional approach to resputtering with embodiments of the methods described herein. FIG. 4A is a cross-sectional depiction of a wafer substrate. The substrate comprises two layers of a dielectric 401. The top layer contains two recesses, a trench 407 and a via 409. Trench 409 is situated above a conductive line 403 in an underlying metallization layer. A field region 411 constitutes the top surface of the substrate.

Figure 4B:
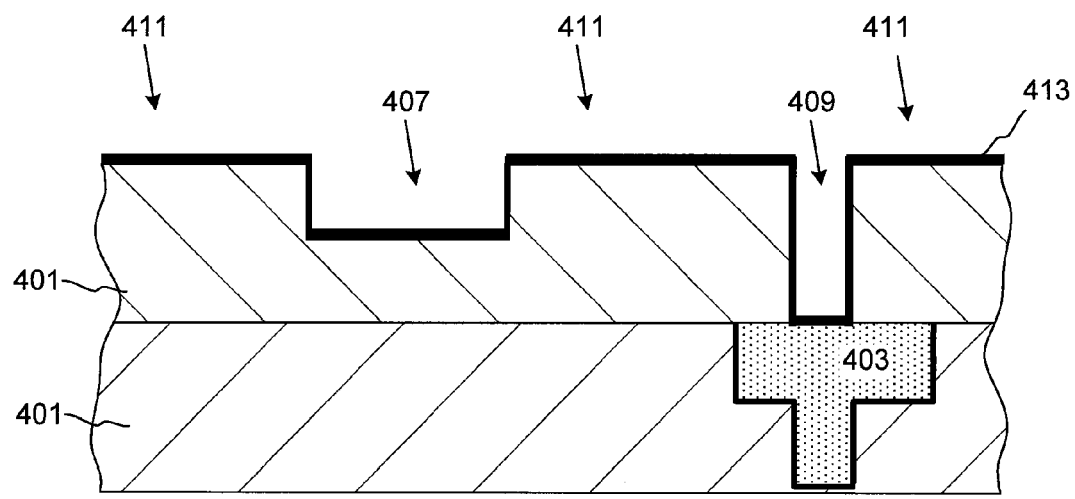

FIG. 4B shows the wafer substrate after deposition of a barrier layer 413 in a manner as described above. Note that the operation associated with deposition of layer 413 could deposit, instead of a barrier layer, any conductive metal layer, such as a copper seed layer. In the depicted examples, barrier layer 413 now covers the via 409, the trench 407 and the field 411.

Figure 4C:
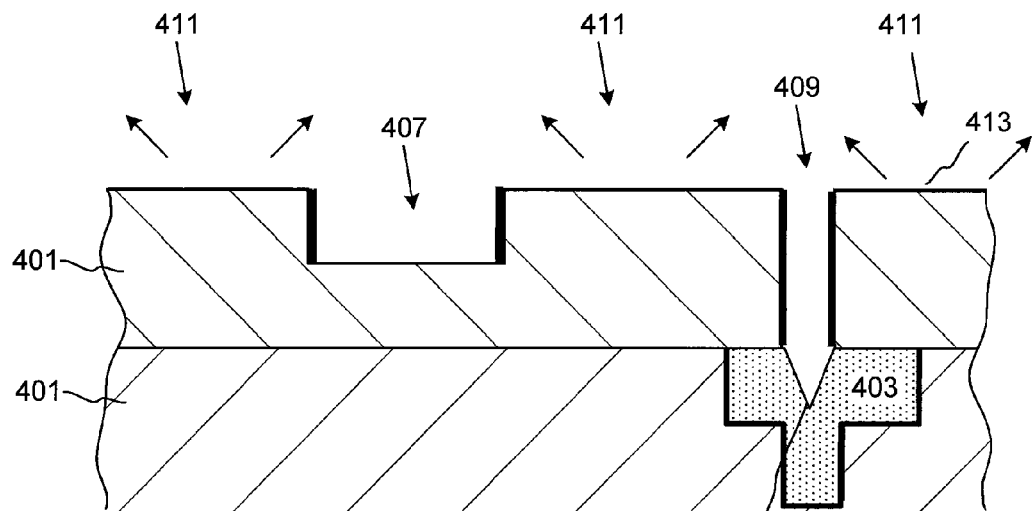

FIG. 4C depicts the wafer substrate after a conventional resputter. The resputter has resulted in a reduction of the barrier layer 413 across the surface of the wafer, including the via 409, the trench 407 and the field 411. The resputtering at the bottom of the via 403 may result in the creation of an anchor 405. The arrows pointing upward indicate that the barrier material on the fields 411 has been lost to the chamber after resputter. It should be noted that the amount of barrier material in trench 407 is greatly reduced, which may be undesirable. Microtrenches such as those depicted in FIG. 3D may also result.

Figure 4D:
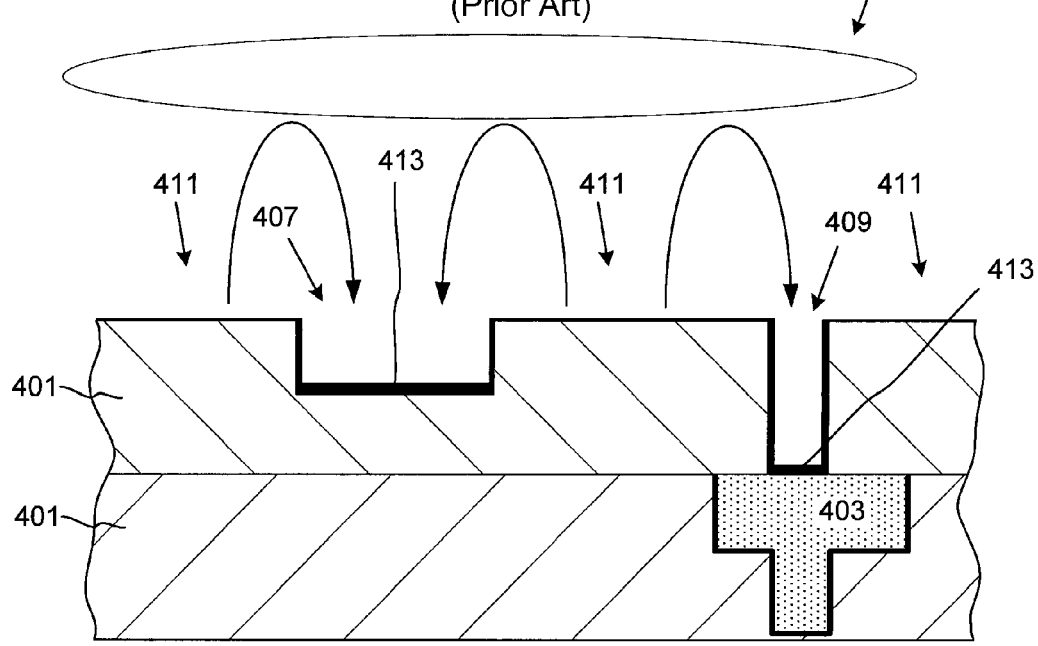

FIG. 4D shows the implementation of one embodiment of the claimed invention. In the depicted embodiment, resputter is taking place under high pressure sufficient to cause momentum transfer reflection of the resputtered material by a high density reflector region 415. As in FIG. 4C, resputtered barrier material is leaving field 411. In contrast to FIG. 4C, however, the resputtered barrier material is being reflected by the reflector 415 toward the via 409 and the trench 407, as demonstrated by the curved arrows.

The reflector 415 is composed of particles in the chamber, which may include neutral and/or ionized process gas and in some embodiments neutral and/or ionized metal atoms, which are densely distributed due to the high pressure. The elliptical shape of the reflector 415 is chosen purely for illustrative purposes and is not meant to convey the spatial boundaries of the particles. Under high pressure, resputtered material with a vertically upward component (away from the substrate surface) has a high probability of colliding with species in the reflector 415 and being reflected back toward the wafer. It is likely that the higher the density of the gas in the chamber proximate the substrate, the greater the extent of the reflection. Other factors may contribute to the extent of the reflection. A mixture of high atomic weight gases, for example, may have a greater reflective effect than any single low atomic weight gas.

The extent of reflection can also be adjusted by configuring the level of pressure. At lower levels of pressure, such as the typical operating pressure of 1-4 mTor, resputtering results in very limited reflection of barrier material and much greater loss of barrier material to the chamber. At much higher levels of pressure, such as 40-60 mTor, much of the resputtered barrier material from the field will be reflected.

Note that the barrier material 413 has collected more heavily in the trench 407 and the via 409 as a result of the reflection. Barrier material that traditionally would have been deposited on the field 411 and wasted in a traditional resputter has been usefully redistributed to the recesses.

The approach embodied in FIG. 4D not only allows for the more efficient use of barrier material, but also may allow for reduced consumption of target metal or even allow for the removal of the source. If sufficient material can be redistributed from the field into the recesses of the wafer, a source and its supporting hardware are no longer necessary at least during the resputter operation. Hence, some embodiments of the resputter operation may be performed in an apparatus that lacks a coil or sputter target. More typically, the power to the coil and/or the sputtering target can be reduced or eliminated.

Figure 4E:
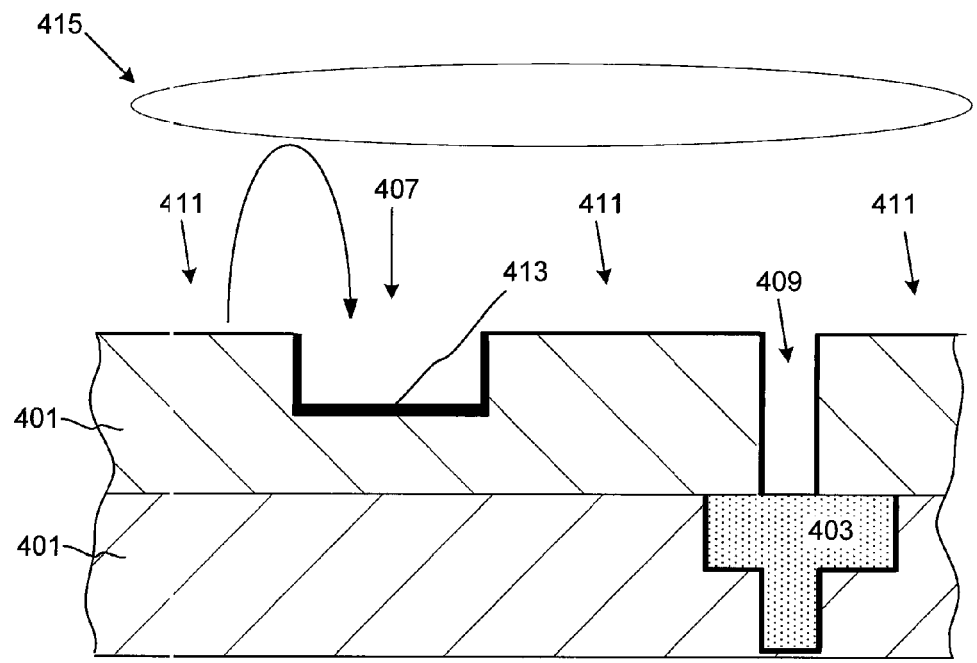

FIG. 4E demonstrates another embodiment of the claimed invention in which net etching takes places in one recess and net deposition takes place in another recess. The barrier layer 413 at the bottom of the via 409 has been etched so that the bottom of via 409 is made substantially coplanar with conductive line 403. Conventionally, when resputter takes place under low pressure, the trench 407 may lose its barrier layer 413. In this embodiment, which takes place under sufficiently high pressure, the barrier layer 413 of the trench 407 has been reinforced by the reflection of resputtered barrier material from the field 411, as depicted by the curved arrow. FIG. 4E demonstrates how an embodiment of the claimed invention can selectively etch away the barrier layer in some portions of the wafer while reinforcing the layer in other portions.

Embodiments of the methods described herein may improve selectivity in at least two ways. As noted earlier, when resputtering is conducted under sufficiently high pressure, the resputtered material, made up of off angle, neutral flux, is reflected back toward the surface of the wafer. The flux tends to settle more easily in recesses with lower aspect ratios, such as fields and trenches. Resputtering as depicted in FIG. 4E can thus result in less material being removed from the trench bottom (or even in a net deposition in the trench bottom) compared to the net etch of material in the narrower via, which attracts less of the flux.

Moreover, it is believed that the pressure and other conditions in the chamber may be adjusted in such a way as to focus the deposition of reflected resputtered material on parts of the wafer. For example, pressure could be adjusted so as to increase the buildup of reflected barrier material on a recess or a portion of a recess.

Figure 4F:
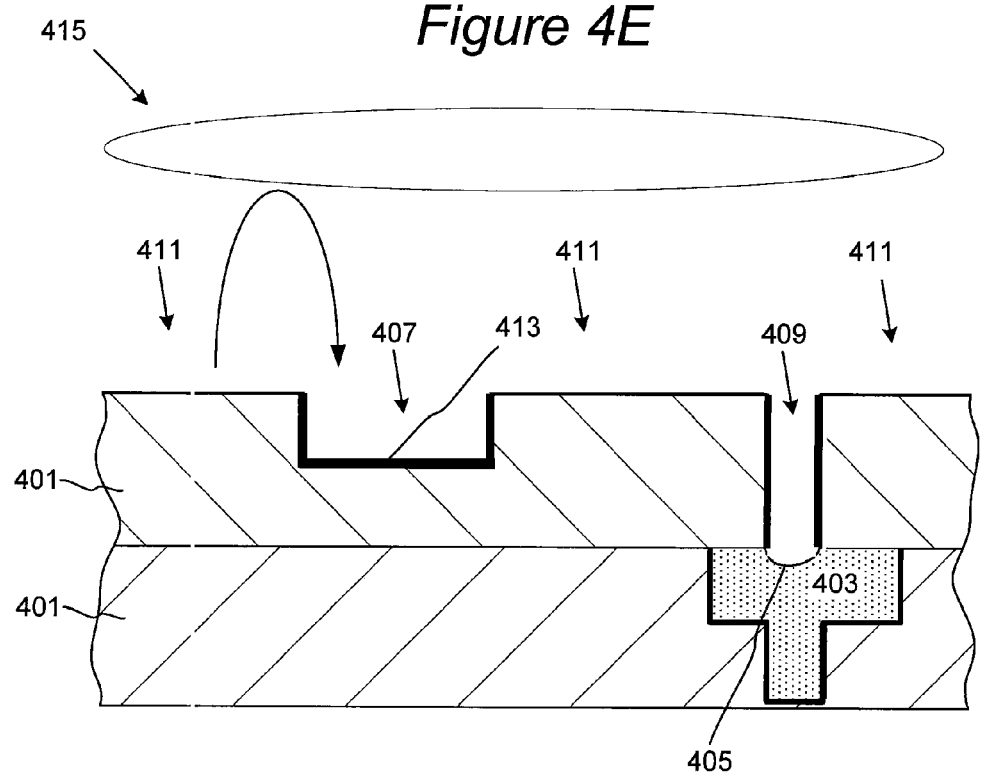

FIG. 4F demonstrates another embodiment of the claimed invention in which resputter under high pressure results in the creation of an anchor at the bottom of the via 403. The barrier layer 413 in the trench 407 is again reinforced by the reflection of barrier material from the field 411 into the trench 407. Note the shape of the anchor 405 in FIG. 4F. An advantage of creating anchors under high pressure is that the anchors generally assume a more rounded shape (compared with resputter at lower pressures). Anchors produced under much lower, more conventional pressures have demonstrated a more pointed shape, as depicted by anchor 405 in FIG. 4C. Rounded anchors result in improved connections over anchors that have sharp corners. They are more mechanically robust. In some embodiments, anchors having a depth of between about 10-600 Å, preferably between about 50-400 Å and a rounded profile are obtained. An anchor can be characterized by a ratio of anchor width to anchor height, where width is equal to the via width at the via bottom, and anchor height is measured at the center of the via bottom. Anchors with aspect ratios of greater than about 1 are preferred. The rounded anchors can be cut by repeating between about 1-10 cycles of deposition and high pressure resputter.

Figure 5A:
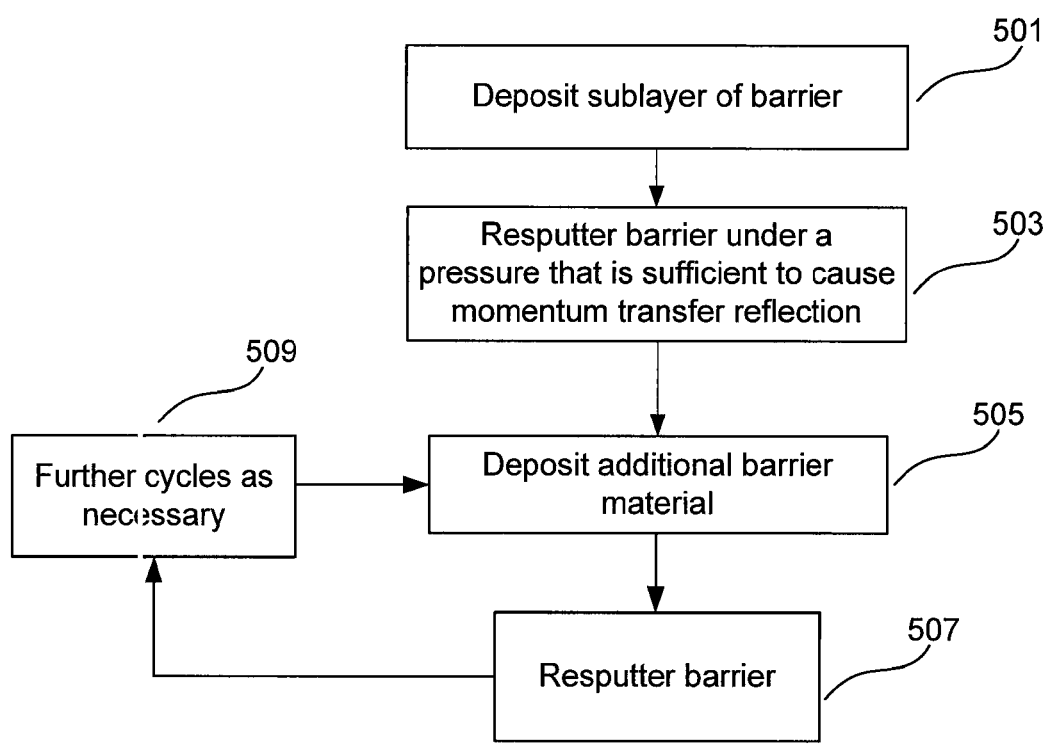
FIGS. 5A-5B present process flow diagrams for a method of depositing a diffusion barrier layer and resputtering the barrier under a pressure sufficient to cause momentum transfer reflection of resputtered material into the recessed features of the substrate. Methods involving the use of a process chamber with and without a target are shown.

One example of a sequence of depositing and resputtering steps is illustrated in FIG. 5A. The steps of FIG. 5A may take place in a chamber with a target. The process starts with the deposition of a barrier sublayer (process block 501). In alternative embodiments, instead of a barrier layer, a copper seed layer may be deposited. In such cases, in the depicted embodiment, references to the barrier layer may be replaced with references to the seed layer. Of course, it is assumed that a barrier layer resides beneath the seed layer. This deposition process may be accomplished by a PVD or iPVD technique but other deposition methods may be also used. These methods may include chemical vapor deposition (CVD), plasma enhanced chemical vapor deposition (PECVD), atomic layer deposition (ALD), electroless deposition, selective reduction of an organometallic precursor from a supercritical solution, and the like. An RF-powered coil, a DC-powered target or other types of hardware may be used as the source of barrier material. The deposited material is then resputtered (503) at a pressure high enough to cause momentum transfer reflection of the resputtered material, such that at least some of the material is deposited in the recessed features of the substrate. The pressure may be between 2-100 mTorr, preferably 20-60 mTorr. The process may stop at this point or, if a more uniform or thicker coverage is desired, more material may be deposited (505) by any of the above mentioned methods, and then resputtered again (507). The depositing and resputtering steps may be optionally repeated as many times as necessary (509).

Figure 5B:
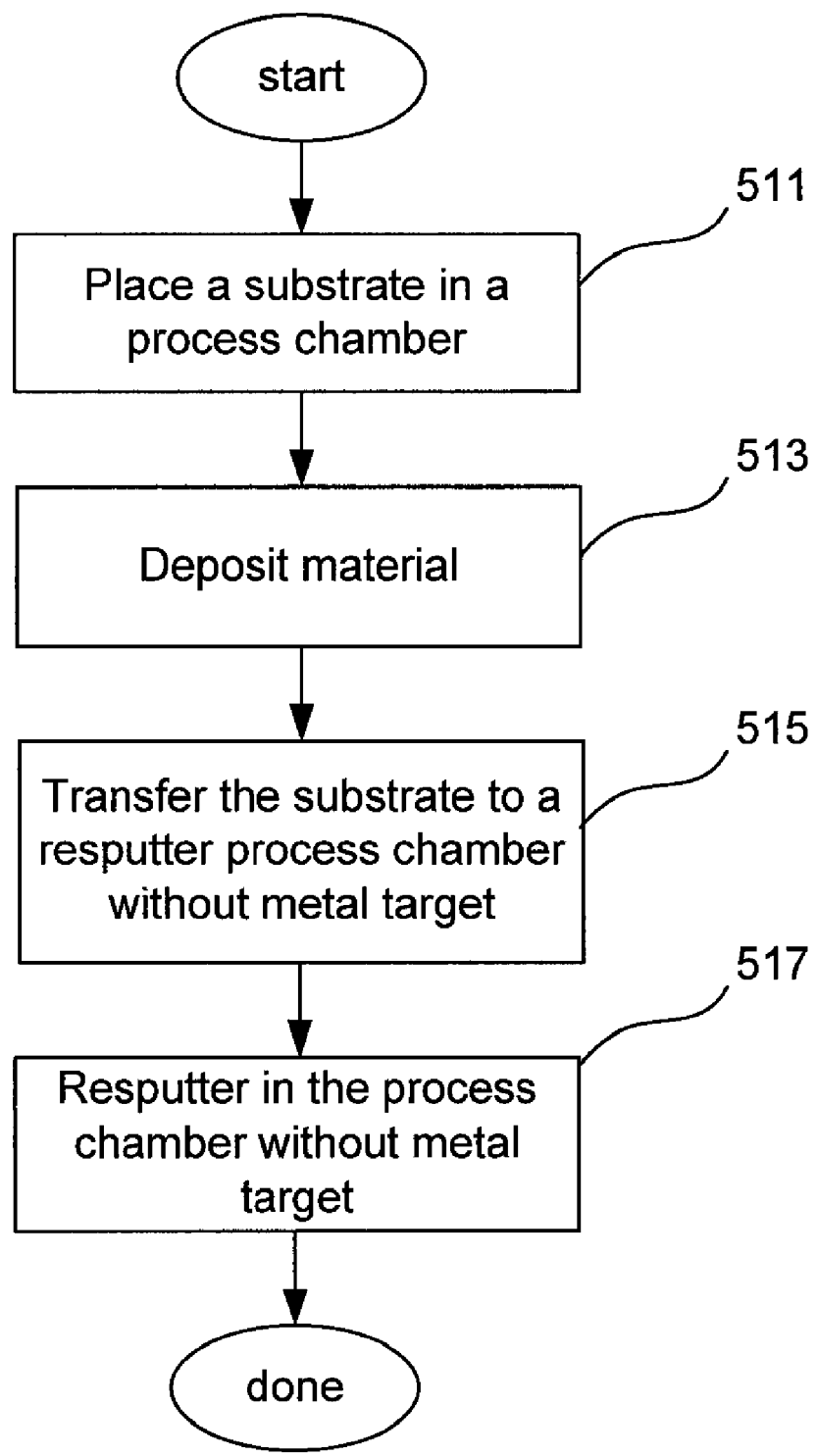

Another example of a sequence of depositing and resputtering steps is illustrated in FIG. 5B. The process starts with the placement of a substrate into a process chamber with a hardware source, such as a coil or target (process block 511). A variety of deposition techniques, conditions, materials and hardware may be used, as was the case with FIG. 5A. Deposition then takes place (process block 513). After the initial deposition, the substrate is transferred to a process chamber that lacks a hardware source (process block 515). The substrate is then resputtered at a pressure sufficient to cause momentum transfer reflection of at least some of the resputtered material into the recessed features of the substrate (process block 517). At high pressures, such as 20-60 mTorr, resputtering leads to the redistribution of material from the field regions to the recesses, thus eliminating the need for the hardware source of secondary material. In some embodiments, one or more additional deposition steps are performed after the material has been redistributed by resputter. For example, in some embodiments, several cycles of deposition and redistribution steps may be performed. In one embodiment, the material may be deposited in an ALD process chamber and may be resputtered using provided chambers in a plasma pre-clean chamber or in a PVD chamber. Subsequently, another depositing operation may be performed, if required.

The processes depicted in FIGS. 5A and 5B serves as an illustration of deposition and resputtering cycles employed to achieve superior coverage and/or selectivity. The present invention is not limited to the process flow schemes shown in FIGS. 5A and 5B, and may include resputtering of all of the barrier layer from the via bottom or punch-through resputter etch into the underlying copper lines. Other steps may be added to the general process flow as necessary.

Apparatus

While the present invention can be practiced in many different types of apparatus, two main types of iPVD apparatus, hollow cathode magnetron (HCM) and planar magnetron, will now be briefly described. Hollow cathode magnetron is an apparatus carrying a three-dimensional sputter target. The present invention is not limited to a specific cup-like geometry of an HCM target and can be used in conjunction with three-dimensional targets of a plurality of shapes.

Figure 6A:
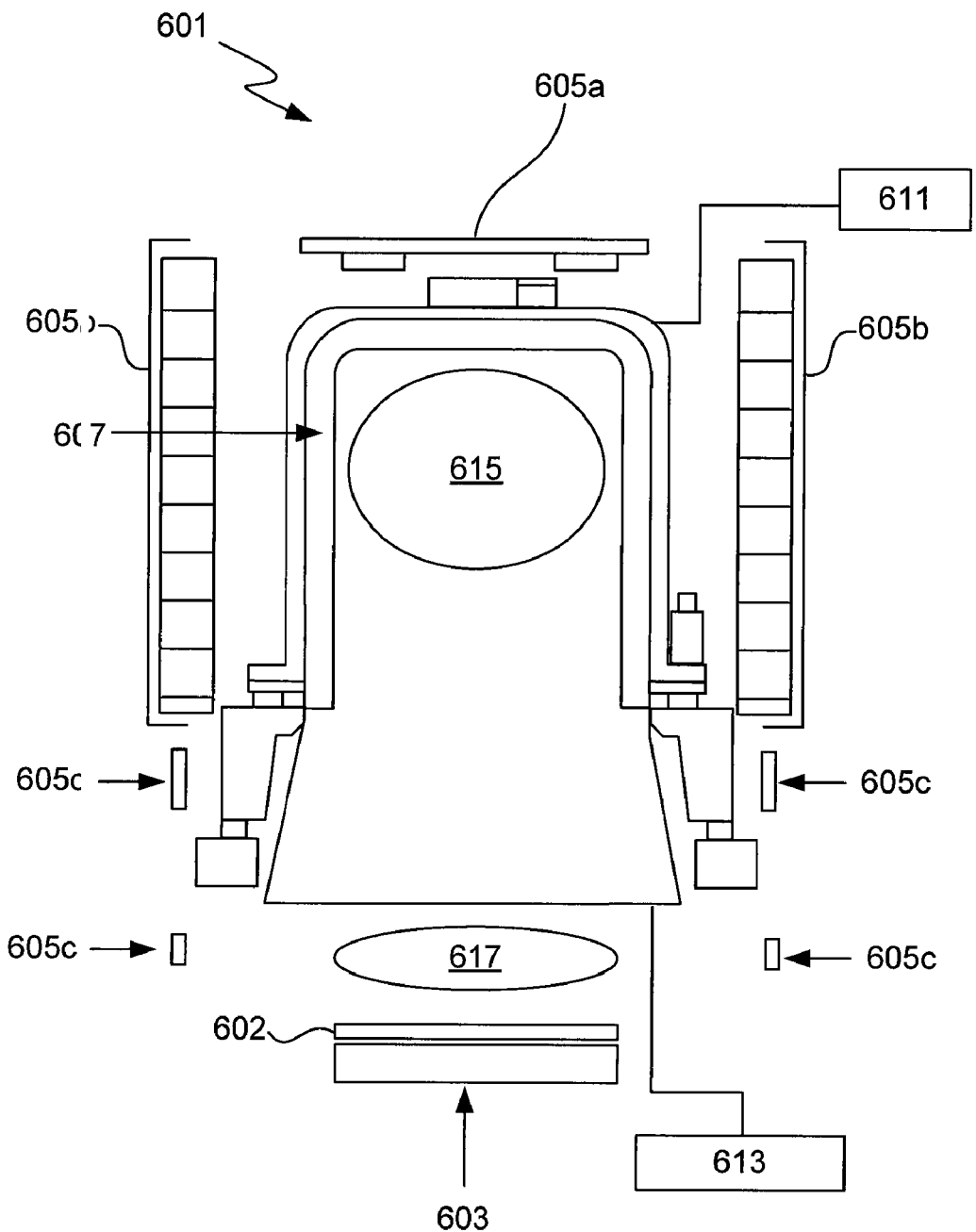
FIG. 6A is a cross sectional depiction of the hollow cathode magnetron (HCM) apparatus suitable for practicing the current invention.

FIG. 6A presents a cross sectional view of one type of HCM sputtering apparatus that can be used in accordance with the invention. The HCM apparatus has two main components, the source 601, in which a plasma is created and maintained, and the RF bias electrostatic chuck (ESC) pedestal 603, which secures the wafer and applies an RF bias on the wafer, if needed. In this example, the source 601 contains several electromagnets 605a-605c, and a cathode target 607. The cathode target 607 generally has a hollow cup-like shape so that plasma formed in the source can be concentrated within this hollow region. The cathode target 607 also serves as a sputter target and is, therefore, made of a metal material such as tantalum, which is to be deposited onto a substrate.

An inert gas, such as argon, is introduced through a gas inlet 613 into the hollow region of the cathode target 607 powered by a DC source to form a plasma. The pump 615 is positioned to evacuate or partially evacuate the process chamber. The control of pressure in the process chamber can be achieved by using a combination of gas flow rate adjustments and pumping speed adjustments, making use of, for example, a throttle valve or a baffle plate. Alternatively, pressure above the wafer can be controlled by varying the height of the wafer pedestal 603. At an increased pedestal height, at some shield configurations, slower gas flow results in a higher pressure above the wafer. An intense magnetic field is produced by electromagnets 605a-605b within the cathode target region. Additional electromagnets 605c are arranged downstream of the cathode target so that different currents can be applied to each electromagnet, thereby producing an ion flux and a controlled deposition and/or etch rate and uniformity. A floating shield 609, existing in equilibrium with the floating plasma potential, is used, in conjunction with the source electromagnets to shape the plasma distribution at the target mouth. A stream of ions is directed to the surface of the wafer, as shown by arrows on FIG. 6A. The ESC pedestal 603 holds the wafer substrate in place and can apply a RF bias to the wafer substrate. The ion energy, and therefore the deposition and/or etch rate can also be controlled by the pedestal RF bias. An additional function of the ESC pedestal is to provide wafer temperature control during deposition and resputtering. In a typical process the pedestal temperature can vary in the range of about −50-600° C. In practice it is often advantageous to cool the wafer pedestal down to temperatures of about −40-−20° C. while the shields of an apparatus are kept at a higher temperature of about 25-500° C., preferably 100-200° C. Typically, argon or helium backside gas is used to provide thermal coupling between the substrate and the ESC.

In certain embodiments, a system controller 611 is employed to control process conditions during deposition and resputter, insert and remove wafers, etc. The controller will typically include one or more memory devices and one or more processors. The processor may include a CPU or computer, analog and/or digital input/output connections, stepper motor controller boards, etc.

In certain embodiments, the controller controls all of the activities of the deposition apparatus. The system controller executes system control software including sets of instructions for controlling the timing, mixture of gases, chamber pressure, chamber temperature, wafer temperature, RF power levels, wafer chuck or susceptor position, and other parameters of a particular process. Other computer programs stored on memory devices associated with the controller may be employed in some embodiments.

Typically there will be a user interface associated with controller 611. The user interface may include a display screen, graphical software displays of the apparatus and/or process conditions, and user input devices such as pointing devices, keyboards, touch screens, microphones, etc.

The computer program code for controlling the deposition and resputtering processes can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck. A plasma control program may include code for setting RF power levels applied to the process electrodes at the target and the wafer chuck.

Examples of chamber sensors that may be monitored during deposition and/or resputtering include mass flow controllers, pressure sensors such as manometers, and thermocouples located in pedestal or chuck. Appropriately programmed feedback and control algorithms may be used with data from these sensors to maintain desired process conditions.

Figure 6B:
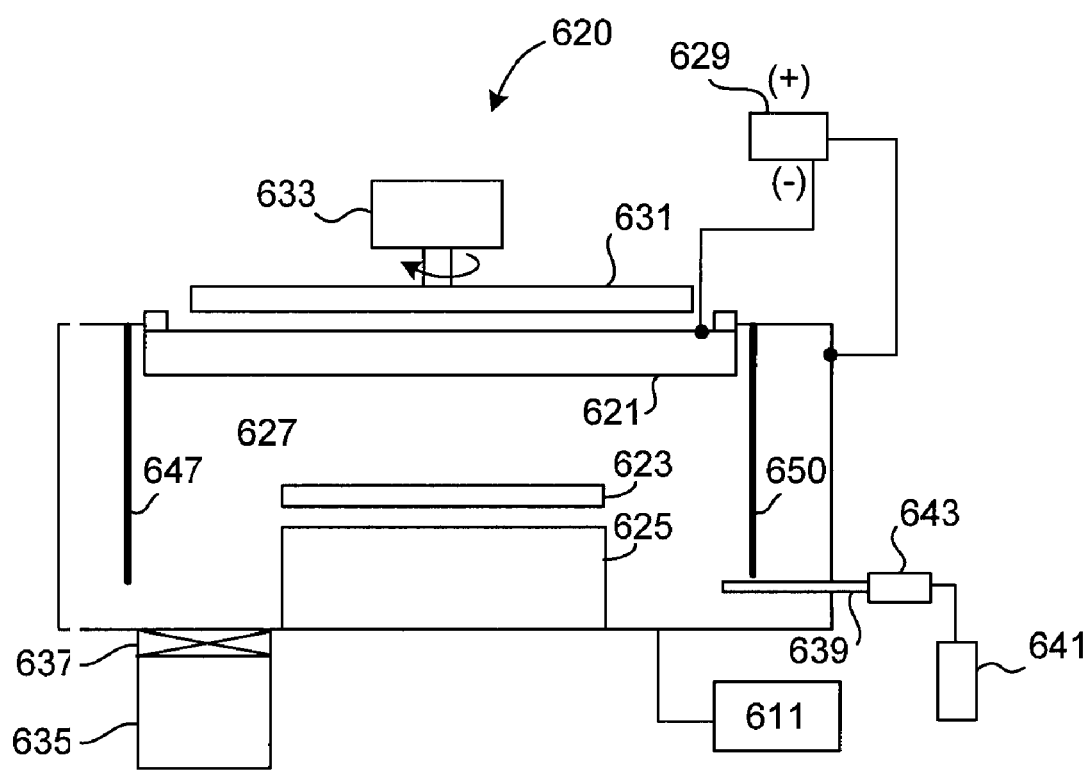
FIG. 6B is a cross sectional depiction of a planar magnetron suitable for practicing the current invention.

FIG. 6B shows a schematic representation of a planar magnetron 620 which can also be used to practice present invention. Target 621, a circular, planar block of material to be deposited, is spaced from the wafer 623, which is mounted on a heating stage 625 in chamber 627. A dc power supply 629 is used to apply a dc field to target 621, establishing a plasma in the chamber below target 621. A circular magnet 631 mounted above the target is rotated by motor 633 setting up a magnetic field extending through target 621 into the region between the target 621 and wafer 623. Cryopump 635 connected to chamber 627 via valve 637 is used to evacuate the chamber. Process gas injector 639 is connected to process gas supply 641 via mass flow controller 643. A sputtering gas is introduced into chamber 627 via injectors 639. It is understood that the structure of module 620 is exemplary only. The methods of present invention may be practiced in other types of planar magnetrons, such as ones having ICP sources. However, it should be understood that since planar magnetrons with ICP sources normally operate at higher pressure than HCM, they should be operated at an even higher pressure in order to achieve the benefit of microtrenching reduction. In one embodiment of this invention certain planar magnetrons, such as magnetrons with internal or external ICP sources, are operated at a pressure range of between about 50 and 100 mTorr, preferably between about 60 and 90 mTorr.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of depositing material on a semiconductor wafer substrate having field regions and recessed features, the method comprising:
    (a) depositing a layer of the material on at least a portion of the field regions of the wafer;
    (b) forming a particle reflector over the semiconductor wafer substrate, wherein the particle reflector is configured for reflecting material resputtered from the semiconductor wafer substrate back to the semiconductor wafer substrate, wherein forming the particle reflector comprises creating a chamber pressure of between about 20-60 mTorr; and (c) resputtering at least the layer residing on the field region of the wafer by impinging the layer with high energy particles under said pressure, wherein said pressure is sufficient to cause momentum transfer reflection of the resputtered material from the particle reflector, so that at least some of the reflected material derived from the field region is deposited in the recessed features of the substrate, wherein the resputtering is performed in an apparatus without an ICP source.

2. The method of claim 1, wherein at least about 10% of the resputtered material is reflected onto the wafer.

3. The method of claim 1, wherein operation (c) further comprises resputtering material residing in bottom portions of the recessed features, wherein resputtering results in net etching of the material residing in bottom portions of at least some of the recessed features.

4. The method of claim 3, wherein the semiconductor wafer substrate comprises a via and a trench and wherein a net etching rate in the via bottom is at least 1.2 times greater than a net etching rate in the trench bottom.

5. The method of claim 3, wherein resputtering the material residing in bottom portions of the recessed features comprises etching copper to form an anchor region in a layer of copper residing underneath of at least some of the recessed features.

6. The method of claim 5, wherein the anchor has a smooth rounded profile and is formed to a depth of between about 10 and 600 Å.

7. The method of claim 1, wherein the semiconductor wafer substrate comprises a via and a trench and wherein in operation (c), E/D ratio at a via bottom is greater than E/D ratio at a trench bottom, and wherein E/D ratio at a trench bottom is greater than an E/D ratio in the field.

8. The method of claim 1, wherein depositing the layer of material comprises sputtering the material using iPVD.

9. The method of claim 1, wherein the material is a diffusion barrier material.

10. The method of claim 1, wherein the material comprises at least one of the following: Ta, $TaN_x$, Ti, $TiN_x$, W, $WN_x$, Ru, and Co.

11. The method of claim 1, wherein the material is copper and/or copper alloys.

12. The method of claim 1, wherein the semiconductor wafer substrate comprises a via and a trench.

13. The method of claim 12, wherein the via and the trench are in a low-k dielectric layer.

14. The method of claim 1, wherein the depositing and resputtering operations are performed in the same process chamber.

15. The method of claim 14, wherein the process chamber comprises a hollow cathode magnetron (HCM).

16. The method of claim 14, wherein the process chamber comprises a planar magnetron.

17. The method of claim 14, wherein operations (a), (b) and (c) are performed in an apparatus that does not have an ICP source.

18. The method of claim 1, wherein the depositing and resputtering operations are performed in different process chambers.

19. The method of claim 18, wherein resputtering is performed in an apparatus that does not include a sputter target.

20. The method of claim 1, wherein operation (c) comprises redistributing material on the processed semiconductor wafer substrate without substantially depositing additional material originating from a source that is extraneous to the processed semiconductor wafer substrate.

21. The method of claim 20, wherein the additional material from the extraneous source is deposited during the resputtering operation at a rate of less than about 0.5 Å/sec, wherein the deposition rate is measured in the field region.

22. The method of claim 20, wherein the extraneous source of material is a sputter target or a sputter coil.

23. The method of claim 1, wherein operations (a) and co are repeated at least once.

24. The method of claim 1, wherein the pressure used in operation (b) is about 40-60 mTorr.

25. The method of claim 1, wherein operations (a) and (b) are performed in one chamber and wherein operation (a) is performed under a pressure of less than about 10 mTorr.

26. A method of redistributing material on a semiconductor wafer substrate having a field region and a recessed feature, the method comprising:
(a) forming a particle reflector over the semiconductor wafer substrate, wherein the particle reflector is configured for reflecting material resputtered from the semiconductor wafer substrate back to the semiconductor wafer substrate, wherein forming the particle reflector comprises creating a chamber pressure of between about 20-60 mTorr; and
resputtering at least a layer of material residing on the field region of the wafer by impinging the layer with high energy particles under said pressure wherein said pressure is sufficient to cause momentum transfer reflection of at least some of the resputtered material from the particle reflector, so that at least some of the resputtered material derived from the field region is deposited in the recessed features of the substrate, wherein the resputtering is performed in an apparatus without an ICP source.

27. The method of claim 26, wherein said pressure is about 40-60 mTorr.

* * * * *

UNITED STATES PATENT AND TRADEMARK OFFICE
CERTIFICATE OF CORRECTION

PATENT NO.        : 8,043,484 B1
APPLICATION NO.   : 11/830777
DATED             : October 25, 2011
INVENTOR(S)       : Robert Rozbicki It is certified that error appears in the above-identified patent and that said Letters Patent is hereby corrected as shown below:

In the Claims:

In Claim 23, at column 16, line 22, change "wherein operations (a) and co" to --wherein operations (a) and (c)--.

Signed and Sealed this
Tenth Day of September, 2013

Teresa Stanek Rea
*Acting Director of the United States Patent and Trademark Office*